(12) United States Patent
Lamansky et al.

(10) Patent No.: US 7,166,010 B2
(45) Date of Patent: Jan. 23, 2007

(54) BUFFER LAYERS FOR ORGANIC ELECTROLUMINESCENT DEVICES AND METHODS OF MANUFACTURE AND USE

(75) Inventors: Sergey A. Lamansky, Apple Valley, MN (US); Manoj Nirmal, St. Paul, MN (US); Fred B. McCormick, Maplewood, MN (US); Ralph R. Roberts, Cottage Grove, MN (US); John P. Baetzold, North St. Paul, MN (US); Todd D. Jones, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 84 days.

(21) Appl. No.: 11/118,574

(22) Filed: Apr. 29, 2005

(65) Prior Publication Data

US 2005/0191776 A1    Sep. 1, 2005

Related U.S. Application Data

(62) Division of application No. 10/183,717, filed on Jun. 26, 2002, now abandoned.

(51) Int. Cl.
*H01J 9/00* (2006.01)
(52) U.S. Cl. .......................... 445/24; 445/25
(58) Field of Classification Search .............. 445/24
See application file for complete search history.

(56) References Cited

U.S. PATENT DOCUMENTS

| 5,158,829 | A | 10/1992 | Wegmann et al. |
| 5,247,226 | A | 9/1993 | Sato et al. |
| 5,281,489 | A | 1/1994 | Mori et al. |
| 5,284,779 | A | 2/1994 | Miyanaga |
| 5,521,035 | A | 5/1996 | Wolk et al. |
| 5,559,400 | A | 9/1996 | Nakayama et al. |
| 5,621,131 | A | 4/1997 | Kreuder et al. |

(Continued)

FOREIGN PATENT DOCUMENTS

DE    198 25 737 A1    12/1999

(Continued)

OTHER PUBLICATIONS

Blochwitz, et al., *Low Voltage Organic Light Emitting Diodes Featuring Doped Phthalocyanine As Hole Transport Material*, Applied Physics Letters, vol. 73, No. 6 729-731 (1998).

(Continued)

*Primary Examiner*—Nimeshkumar D. Patel
*Assistant Examiner*—Dalei Dong
(74) *Attorney, Agent, or Firm*—Lance L. Vietzke

(57) ABSTRACT

Organic electroluminescent device can be formed with multiple layers including an electrode, an emission layer, and a buffer layer. The emission layer includes a light emitting material. The buffer layer is disposed between and in electrical communication with the electrode and the emission layer and includes a triarylamine hole transport material and an electron acceptor material. The buffer layer optionally includes one or more of a) a polymeric binder, b) a color converting material, and c) light scattering particles. The buffer layer can also be formed using a polymeric hole transport material having a plurality of triarylamine moieties.

14 Claims, 2 Drawing Sheets

U.S. PATENT DOCUMENTS

| | | | |
|---|---|---|---|
| 5,639,896 A | 6/1997 | Kalz et al. | |
| 5,691,098 A | 11/1997 | Busman et al. | |
| 5,693,446 A | 12/1997 | Staral et al. | |
| 5,695,907 A | 12/1997 | Chang | |
| 5,708,130 A | 1/1998 | Woo et al. | |
| 5,710,097 A | 1/1998 | Staral et al. | |
| 5,725,989 A | 3/1998 | Chang et al. | |
| 5,728,801 A | 3/1998 | Wu et al. | |
| 5,747,217 A | 5/1998 | Zaklika et al. | |
| 5,766,827 A | 6/1998 | Bills et al. | |
| 5,840,217 A | 11/1998 | Lupo et al. | |
| 5,858,562 A | 1/1999 | Utsugi et al. | |
| 5,863,860 A | 1/1999 | Patel et al. | |
| 5,869,350 A | 2/1999 | Heeger et al. | |
| 5,897,727 A | 4/1999 | Staral et al. | |
| 5,900,327 A | 5/1999 | Pei et al. | |
| 5,929,194 A | 7/1999 | Woo et al. | |
| 5,976,698 A | 11/1999 | Staral et al. | |
| 5,981,136 A | 11/1999 | Chang et al. | |
| 5,998,045 A | 12/1999 | Chen et al. | |
| 5,998,085 A | 12/1999 | Isberg et al. | |
| 6,030,715 A | 2/2000 | Thompson et al. | |
| 6,057,048 A | 5/2000 | Hu et al. | |
| 6,057,067 A | 5/2000 | Isberg et al. | |
| 6,099,994 A | 8/2000 | Chang et al. | |
| 6,114,088 A | 9/2000 | Wolk et al. | |
| 6,121,727 A | 9/2000 | Kanai et al. | |
| 6,132,641 A | 10/2000 | Rietz et al. | |
| 6,140,009 A | 10/2000 | Wolk et al. | |
| 6,150,043 A | 11/2000 | Thompson et al. | |
| 6,169,163 B1 | 1/2001 | Woo et al. | |
| 6,190,826 B1 | 2/2001 | Chang et al. | |
| 6,194,119 B1 | 2/2001 | Wolk et al. | |
| 6,214,520 B1 | 4/2001 | Wolk et al. | |
| 6,221,543 B1 | 4/2001 | Guehler et al. | |
| 6,221,553 B1 | 4/2001 | Wolk et al. | |
| 6,228,543 B1 | 5/2001 | Mizuno et al. | |
| 6,228,555 B1 | 5/2001 | Hoffend, Jr. et al. | |
| 6,242,115 B1 | 6/2001 | Thomson et al. | |
| 6,242,152 B1 | 6/2001 | Staral et al. | |
| 6,270,934 B1 | 8/2001 | Chang et al. | |
| 6,270,944 B1 | 8/2001 | Wolk et al. | |
| 6,294,273 B1 | 9/2001 | Heuer et al. | |
| 6,485,844 B1 | 11/2002 | Strangman et al. | |
| 6,566,807 B1 | 5/2003 | Fujita et al. | |
| 6,573,650 B2 | 6/2003 | Aoki et al. | |
| 6,690,109 B2 | 2/2004 | Tada | |
| 6,699,597 B2* | 3/2004 | Bellmann et al. | 428/690 |
| 6,805,979 B2* | 10/2004 | Ogura et al. | 428/690 |
| 6,844,128 B2* | 1/2005 | Hsu et al. | 430/200 |
| 6,909,231 B2* | 6/2005 | Miyadera | 313/504 |
| 7,014,978 B2* | 3/2006 | Bellmann et al. | 430/200 |
| 7,094,902 B2* | 8/2006 | Roberts et al. | 548/128 |
| 2004/0004433 A1 | 1/2004 | Lamansky et al. | |

FOREIGN PATENT DOCUMENTS

| | | |
|---|---|---|
| EP | 1 017 118 | 7/2000 |
| JP | 2000-195673 | 7/2000 |
| WO | WO 97/33193 | 9/1997 |
| WO | WO 98/55561 | 12/1998 |
| WO | WO 99/40655 | 8/1999 |
| WO | WO 00/17911 | 3/2000 |
| WO | WO 00/18851 | 4/2000 |
| WO | WO 00/69649 | 11/2000 |
| WO | WO 01/18888 A1 | 3/2001 |
| WO | WO 01/39986 | 6/2001 |
| WO | WO 02/22372 | 3/2002 |
| WO | WO 02/22374 | 3/2002 |

OTHER PUBLICATIONS

Bruchez, Jr. et al., *Semiconductor Nanocrystals As Fluorescent Biological Labels*, Science, 281, 2013 (1998).

Chen, et al., *Recent Developments In Molecular Organic Electroluminescent Materials*, Macromol. Symp., 125, 1 (1997).

Friend, et al., *Electroluminescence in Conjugated Polymers*, Nature, 397, 121 (1999).

Fujikawa, et al., *Energy Structures of Triphenylamine Oligomers*, Synthetic Metals, 91, 161 (1997).

Grazulevicius, et al., *Charge-Transporting Polymers and Molecular Glasses*, Handbook of Advanced Electronic and Photonic Materials and Devices, H.S. Nalwa (ed.), 10, 233-274 (2001).

Kido, J., et al., *Bright Organic Electroluminescent Devices Having A Metal-Doped Electron-Injecting Layer*, Applied Physics Letters, American Institute of Physics, vol. 73, No. 20, Nov. 16, 1998.

Kraft, et al., *Electroluminescent Conjugated Polymers—Seeing Polymers In A New Light*, Angew. Chem. Int. Ed., 37, 402-428 (1998).

Park, et al., *A Convenient Synthesis of 3,6-Substituted Carbazoles Via Nickel Catalyzed Cross-Coupling*, Tetrahedron, 119, 54 (42), 12707-12714.

Raymond et al., *Total Synthesis And Emission Properties Of Poly[9,9-Dihexylfluorene)-Co-(NN'-Diphenyl-NN'-Di(P-Butylphenyl)-1,4-Phenylenediamine)]*, Polymer Preprints, 42(2), 587-588 (2001).

Sato, et al., *Organic Electroluminescent Devices with Polymer Buffer Layer*, Proceedings of SPIE, vol. 4105, 134-142 (2001).

Schaer, et al., *Water Vapor and Oxygen Degradation Mechanisms in Organic Light Emitting Diodes*, Adv. Funct. Mater., vol. 11, No. 2 116-121 (2001).

Shirota, *Organic Materials For Electronic And Optoelectronic Devices*, J. Mater. Chem., 10, 1-25 (2000).

Tew, et al., *Supramolecular Materials With Electroactive Chemical Functions*, Angew. Chem. Int. ed., 39, 517 (2000).

Van Slyke, et al., *Organic Electroluminescent Devices With Improved Stability*, Appl. Phys. Lett., vol. 69 (15) 2160-2162 (1996).

Zhou et al., *Very-Low-Operating-Voltage Organic Light-Emitting Diodes Using A P-Doped Amorphous Hole Injection Layer*, Applied Physics Letters, vol. 78, No. 4 410-412 (2001).

Zhou et al., *Enhanced Hole Injection Into Amorphous Hole-Transport Layers Of Organic Light-Emitting Diodes Using Controlled P-Type Doping*, Adv. Funct. Mater., vol. 11, No. 4 310-314 (2001).

* cited by examiner

US 7,166,010 B2

BUFFER LAYERS FOR ORGANIC ELECTROLUMINESCENT DEVICES AND METHODS OF MANUFACTURE AND USE

This application is a divisional of U.S. Ser. No. 10/183,717, filed Jun. 26, 2002 now abandoned, the disclosure of which is herein incorporated by reference.

BACKGROUND OF THE INVENTION

Organic electroluminescent devices (OELs) include layers of organic materials, at least one of which can conduct a charge. Examples of organic electroluminescent devices include organic light emitting diodes (OLEDs). Specific OEL devices, sometimes referred to as lamps, are desirable for use in electronic media because of their thin profile, low weight, and low driving voltage. OEL devices have potential use in applications such as, for example, lighting applications, backlighting of graphics, pixelated displays, and large emissive graphics.

OEL devices typically include an organic light emitter layer and optionally one or more charge transport layers, all of which are sandwiched between two electrodes: a cathode and an anode. Charge carriers, electrons and holes, are injected from the cathode and anode, respectively. Electrons are negatively charged atomic particles and holes are vacant electron energy states that behave as though they are positively charged particles. The charge carriers migrate to the emitter layer, where they combine to emit light.

This basic OEL device structure can be modified to improve or enhance one or more electrical, chemical, or physical properties of the device. Such modification can include the addition or modification of one or more of the basic layers.

SUMMARY OF THE INVENTION

Generally, the present invention relates to organic electroluminescent devices, articles containing the organic electroluminescent devices, and methods of making and using the organic electroluminescent devices and articles.

One embodiment is an electroluminescent device having multiple layers including, but not limited to, an electrode, an emission layer, and a buffer layer. The emission layer includes a light emitting material. The buffer layer is disposed between and in electrical communication with the electrode and the emission layer and includes a triarylamine hole transport material and an electron acceptor material. The buffer layer optionally includes one or more of a) a polymeric binder, b) a color converting material, and c) light scattering particles.

Another embodiment is a method of making an electroluminescent device. The method includes forming an electrode, coating a buffer layer from solution over the electrode, and disposing an emission layer over the buffer layer. The electrode, buffer layer, and emission layer are in electrical communication. The emission layer includes a light emitting material. The buffer layer includes a triarylamine hole transport material and an electron acceptor material. Optionally, the buffer layer includes one or more of a) a polymeric binder, b) a color converting material, and c) light scattering particles.

Yet another embodiment is an electroluminescent device having multiple layers including, but not limited to, an electrode, an emission layer, and a buffer layer. The emission layer includes a light emitting material. The buffer layer is disposed between and in electrical communication with the electrode and the emission layer. The buffer layer includes (a) a polymeric hole transport material having triarylamine moieties and (b) an electron acceptor material. Optionally, the buffer layer includes one or more of a) a color converting material, and b) light scattering particles.

Another embodiment is a method of making an electroluminescent device. The method includes forming an electrode, coating a buffer layer from solution over the electrode, and disposing an emission layer over the buffer layer. The electrode, buffer layer, and emission layer are in electrical communication. The emission layer includes a light emitting material. The buffer layer includes (a) a polymeric hole transport material having triarylamine moieties and (b) an electron acceptor material. Optionally, the buffer layer includes one or more of a) a color converting material, and b) light scattering particles.

The above summary of the present invention is not intended to describe each disclosed embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
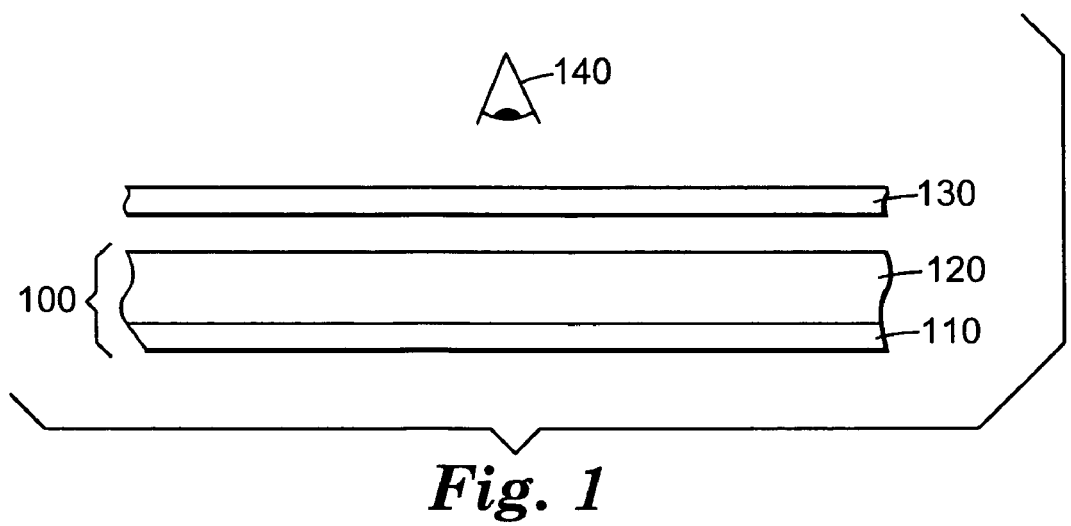
FIG. 1 is a schematic side view of an organic electroluminescent display construction.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION OF THE PREFERRED EMBODIMENT

The present invention is believed to be applicable to electroluminescent devices, articles containing the electroluminescent devices, and methods of making and using the electroluminescent devices and articles. In particular, the present invention is directed to organic electroluminescent devices containing a buffer layer with a triarylamine material and an electron acceptor material, articles containing the organic electroluminescent devices, and methods of making and using the organic electroluminescent devices and articles. Pixelated and non-pixelated electroluminescent displays, backlights, and other lighting components are examples of some of the articles that can include organic electroluminescent devices. While the present invention is not so limited, an appreciation of various aspects of the invention will be gained through a discussion of the examples provided below.

Organic electroluminescent device refers to an electroluminescent device that includes an organic emissive material. The emissive material can include, for example, a small molecule (SM) emitter, a SM doped polymer, a light emitting polymer (LEP), a doped LEP, a blended LEP, or any combination of these materials. This emissive material can be provided alone or in combination with any other organic or inorganic materials, including, for example, binders, color converting materials, and scattering materials, that are functional or non-functional in the organic electroluminescent device.

R. H. Friend, et al. ("Electroluminescence in Conjugated Polymers" Nature, 397, 1999, 121, incorporated herein by reference) describe one mechanism of electroluminescence as including the "injection of electrons from one electrode and holes from the other, the capture of oppositely charged carriers (so-called recombination), and the radiative decay of the excited electron-hole state (exciton) produced by this recombination process."

As an example of electroluminescent device structure, FIG. 1 illustrates an organic electroluminescent device 100 that includes a device layer 110 and a substrate 120. Any other suitable device component can also be included with the device 100. Optionally, additional optical elements or other devices suitable for use with electronic displays, devices, or lamps can be provided between the display 100 and a viewer position 140 as indicated by an optional element 130.

Substrate 120 can be any substrate suitable for the electroluminescent device application. For example, substrate 120 can include glass, clear plastic, or other suitable material(s) that are substantially transparent to visible light. Examples of suitable plastic substrates include those made of polymers such as polyolefins, polyethersulfones, polycarbonates, polyesters, and polyarylates. Substrate 120 can also be opaque to visible light such as, for example, stainless steel, crystalline silicon, poly-silicon, or the like. Because some materials in electroluminescent devices can be particularly susceptible to damage due to exposure to oxygen or water, substrate 120 preferably provides an adequate environmental barrier or is supplied with one or more layers, coatings, or laminates that provide an adequate environmental barrier.

Substrate 120 can also include any number of devices or components suitable in electroluminescent devices and displays such as, for example, transistor arrays and other electronic devices; color filters, polarizers, wave plates, diffusers, and other optical devices; insulators, barrier ribs, black matrix, mask works and other such components; and the like. Generally, one or more electrodes is coated, deposited, patterned, or otherwise disposed on substrate 120 before forming the remaining layer or layers of the electroluminescent device or devices of the device layer 110. When a light transmissive substrate 120 is used and the organic electroluminescent device or devices are bottom emitting, the electrode or electrodes that are disposed between the substrate 120 and the emissive material(s) are preferably substantially transparent to light. For example, transparent conductive electrodes such as indium tin oxide (ITO) or any of a number of other semi-transparent or transparent conductive oxides or nitrides, or semi-transparent or transparent metals can be used.

Element 130 can be any element or combination of elements suitable for use with electroluminescent device 100. For example, element 130 can be an LCD module when device 100 is a backlight. One or more polarizers or other elements can be provided between the LCD module and the backlight device 100, for instance an absorbing or reflective clean-up polarizer. Alternatively, when device 100 is itself an information display, element 130 can include one or more of polarizers, wave plates, touch panels, antireflective coatings, anti-smudge coatings, projection screens, brightness enhancement films, scattering films, light extraction films, refractive index gradient films, or other optical components, coatings, user interface devices, or the like.

In some embodiments like the one shown, device layer 110 includes one or more electroluminescent devices that emit light through the substrate toward a viewer position 140 The viewer position 140 is used generically to indicate an intended destination for the emitted light whether it be an actual human observer, a screen, an optical component, an electronic device, or the like. In other embodiments (not shown), device layer 110 is positioned between substrate 120 and the viewer position 140. The device configuration shown in FIG. 1 (termed "bottom emitting") may be used when, for example, substrate 120 is transmissive to light emitted by device layer 110 and when a transparent conductive electrode is disposed in the device between the emissive layer of the device and the substrate. The inverted configuration (termed "top emitting") may be used when, for example, substrate 120 does or does not transmit the light emitted by the device layer and the electrode disposed between the substrate and the light emitting layer of the device does not transmit the light emitted by the device. In yet other embodiments, the device may emit from both the top and bottom, in which case both conductive electrodes are preferably transparent or semi-transparent.

Device layer 110 can include one or more electroluminescent devices arranged in any suitable manner. For example, in lamp applications (e.g., backlights for liquid crystal display (LCD) modules), device layer 110 can constitute a single electroluminescent device that spans an entire intended backlight area. Alternatively, in other lamp applications, device layer 110 can constitute a plurality of closely spaced electroluminescent devices that can be contemporaneously activated. For example, relatively small and closely spaced red, green, and blue light emitters can be patterned between common electrodes so that device layer 110 appears to emit white light when the emitters are activated. Other arrangements for backlight applications are also contemplated.

In direct view or other display applications, it may be desirable for device layer 110 to include a plurality of independently addressable electroluminescent devices that emit the same or different colors. Each device can represent a separate pixel or a separate sub-pixel of a pixilated display (e.g., high resolution display), a separate segment or sub-segment of a segmented display (e.g., low information content display), or a separate icon, portion of an icon, or lamp for an icon (e.g., indicator applications).

In at least some instances, an electroluminescent device includes a thin layer, or layers, of one or more suitable materials sandwiched between a cathode and an anode. When activated, electrons are injected into the layer(s) from the cathode and holes are injected into the layer(s) from the anode. As the injected charges migrate towards the oppositely charged electrodes, the charges can recombine to form electron-hole pairs which are typically referred to as excitons. The region of the device in which the exitons are generally formed can be referred to as the recombination zone. These excitons, or excited state species, can emit energy in the form of light as they decay back to a ground state.

Other layers can also be present in electroluminescent devices such as hole transport layers, electron transport layers, hole injection layers, electron injection layers, hole blocking layers, electron blocking layers, buffer layers, and the like. In addition, photoluminescent materials can be present in the electroluminescent or other layers in electroluminescent devices, for example, to convert the color of light emitted by the electroluminescent material to another color. These and other such layers and materials can be used to alter or tune the electronic properties and behavior of the layered electroluminescent device, for example, to achieve one or more features such as a desired current/voltage response, a desired device efficiency, a desired color, a desired brightness, a desired device lifetime, or a desired combination of these features.

Figure 2:
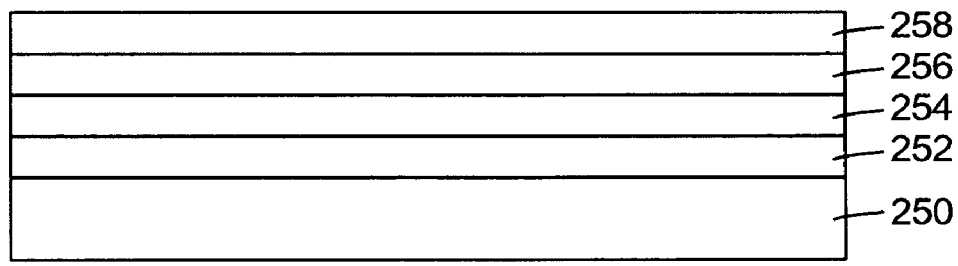
FIG. 2 is a schematic side view of a first embodiment of an electroluminescent device, according to the present invention.
Figure 3:
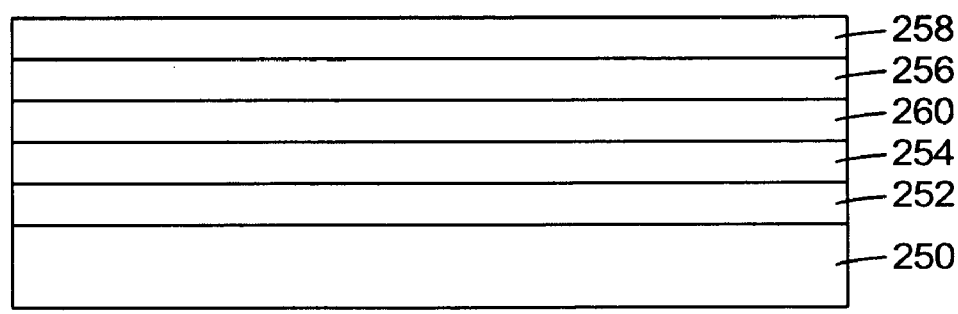
FIG. 3 is a schematic side view of a second embodiment of an electroluminescent device, according to the present invention.
Figure 4:
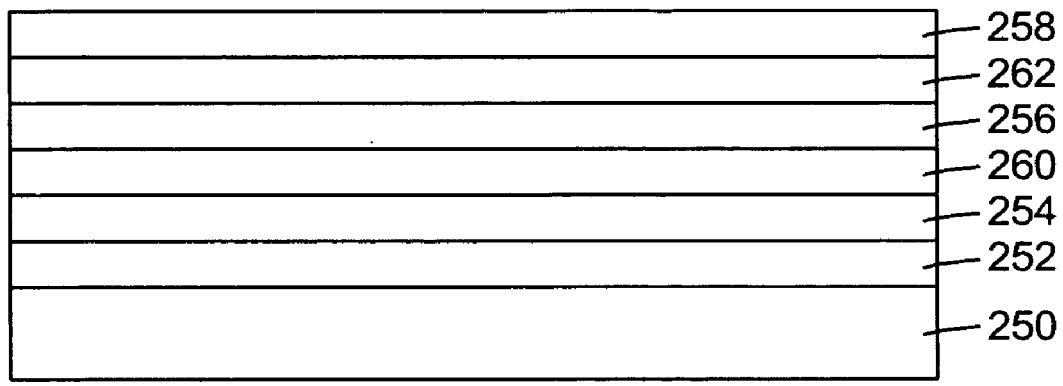
FIG. 4 is a schematic side view of a third embodiment of an electroluminescent device, according to the present invention.

FIGS. 2, 3, and 4 illustrate examples of different electroluminescent device configurations where like elements are provided the same reference numeral. Each configuration includes a substrate 250, an anode 252, a buffer layer 254, an emission layer 256, and a cathode 258. The configurations of FIGS. 3 and 4 also include a hole transport layer 260 between the buffer layer 254 and the emission layer 256. Alternatively or additionally, a hole transport layer (not shown) may be positioned between the anode and the buffer layer. The configuration of FIG. 4 includes an electron transport or electron injection layer 262. The substrate 250 can be made of any of the materials discussed with respect to substrate 120 of FIG. 1. Optionally, a hole injection layer, electron injection layer, or both can also be added or the hole transport layer 260 could be removed. In some embodiments, the buffer layer 254 acts, at least in part, as a hole injection layer or hole transport layer. In addition, any of the layers illustrated in FIGS. 2, 3, and 4 can be formed using a single layer of material or multiple layers of the same or different materials. The material for each layer can be a single compound or a combination of two or more different compounds.

The anode 252 and cathode 258 are typically formed using conducting materials such as metals, alloys, metallic compounds, metal oxides, conductive ceramics, conductive dispersions, and conductive polymers, including, for example, gold, silver, copper, platinum, palladium, aluminum, calcium, barium, magnesium, titanium, titanium nitride, indium oxide, indium tin oxide (ITO), vanadium oxide, zinc tin oxide, fluorine tin oxide (FTO), polyaniline, polypyrrole, polythiophene, and combinations or alloys of these materials. The anode 252 and the cathode 258 can be single layers of conducting materials or they can include multiple layers. For example, an anode or a cathode can include a layer of aluminum and a layer of gold, a layer of calcium and a layer of aluminum, a layer of lithium fluoride and a layer of aluminum, a layer of magnesium and silver, a layer of magnesium and silver followed by another layer of silver, or a metal layer and a conductive organic layer.

The emission layer 256 includes one or more light emitting materials, such as a small molecule (SM) emitter, a SM doped polymer, a light emitting polymer (LEP), a doped LEP, a blended LEP, another organic emissive material, or any combination of these materials. Examples of classes of suitable LEP materials include poly(phenylenevinylene)s (PPVs), poly-para-phenylenes (PPPs), polyfluorenes (PFs), other LEP materials now known or later developed, and co-polymers or blends thereof. Suitable LEPs can also be molecularly doped, dispersed with luminescent dyes or other photoluminescent (PL) materials, blended with active or non-active materials, dispersed with active or non-active materials, and the like. Examples of suitable LEP materials are described in, for example, Kraft, et al., *Angew. Chem. Int. Ed.*, 37, 402–428 (1998); U.S. Pat. Nos. 5,621,131; 5,708,130; 5,728,801; 5,840,217; 5,869,350; 5,900,327; 5,929,194; 6,132,641; and 6,169,163; and PCT patent application Publication No. 99/40655, all of which are incorporated herein by reference.

SM materials are generally non-polymer organic or organometallic molecular materials that can be used in organic electroluminescent displays and devices as emitter materials, charge transport materials, as dopants in emitter layers (e.g., to control the emitted color) or charge transport layers, and the like. Commonly used SM materials include metal chelate compounds, for example, tris(8-hydroxyquinoline) aluminum (AlQ) and derivatives thereof, and organic compounds, for example, N,N'-bis(3-methylphenyl)-N,N'-bis(phenyl)benzidine (TPD). Other SM materials are disclosed in, for example, C. H. Chen, et al., *Macromol. Symp.* 125, 1 (1997), Japanese Laid Open Patent Application 2000-195673, U.S. Pat. Nos. 6,030,715, 6,150,043, and 6,242,115 and, PCT patent applications Publication Nos. WO 00/18851 (divalent lanthanide metal complexes), WO 00/70655 (cyclometallated iridium compounds and others), and WO 98/55561, all of which are incorporated herein by reference.

The optional hole transport layer 260 facilitates the injection of holes from the anode into the device and their migration towards the recombination zone. The hole transport layer 260 can further act as a barrier for the passage of electrons to the anode 252 The hole transport layer 260 can include, for example, a diamine derivative, such as N,N'-bis(3-methylphenyl)-N,N'-bis(phenyl)benzidine (also known as TPD) or N,N'-bis(3-naphthalen-2-yl)-N,N'-bis(phenyl)benzidine (NPD), or a triarylamine derivative, such as, 4,4',4"-Tris(N,N-diphenylamino)triphenylamine (TDATA), 4,4',4"-tris(N-3-methylphenyl-N-phenylamino) triphenylamine (MTDATA), 4,4',4"-tri(N-phenothiazinyl) triphenylamine (TPTTA), 4,4',4"-tri(N-phenoxazinyl) triphenylamine (TPOTA). Other examples include copper phthalocyanine (CuPC); 1,3,5-Tris(4-diphenylaminophenyl)benzenes (TDAPBs); poly(vinyl carbazole); and other compounds such as those described in Shirota, *J. Mater. Chem.*, 10, 1 (2000), H. Fujikawa, et al., *Synthetic Metals*, 91, 161 (1997), and J. V. Grazulevicius, P. Strohriegl, "Charge-Transporting Polymers and Molecular Glasses", *Handbook of Advanced Electronic and Photonic Materials and Devices*, H. S. Nalwa (ed.), 10, 233–274 (2001), all of which are incorporated herein by reference.

The optional electron transport layer 262 facilitates the injection of electrons and their migration towards the recombination zone. The electron transport layer 262 can further act as a barrier for the passage of holes to the cathode 258, if desired. As an example, the electron transport layer 262 can be formed using the organometallic compound tris(8-hydroxyquinolato) aluminum (AlQ). Other examples of electron transport materials include 3-(4-biphenylyl)-4-phenyl-5-(4-tert-butylphenyl)-1,2,4-triazole (TAZ), 1,3-bis[5-(4-(1,1-dimethylethyl)phenyl)-1,3,4-oxadiazol-2-yl]benzene, 2-(biphenyl-4-yl)-5-(4-(1,1-dimethylethyl)phenyl)-1, 3,4-oxadiazole (tBuPBD) and other compounds described in Shirota, *J. Mater. Chem.*, 10, 1 (2000), C. H. Chen, et al., *Macromol. Symp.* 125, 1 (1997), and J. V. Grazulevicius, P. Strohriegl, "Charge-Transporting Polymers and Molecular Glasses", *Handbook of Advanced Electronic and Photonic*

*Materials and Devices*, H. S. Nalwa (ed.), 10, 233 (2001), all of which are incorporated herein by reference.

The buffer layer 254 facilitates the injection of holes from the anode into the hole transport layer 260 or emission layer 256. The buffer layer may also assist in planarization of previously formed layers, such as the anode. This planarization may also assist in reducing or eliminating short circuits due to non-uniformity in the anode. In addition, the buffer layer may facilitate formation of other layers on the buffer layer, including the forming of other layers by thermal transfer onto the buffer layer.

The buffer layer includes a triarylamine material and an electron acceptor material. The triarylamine material includes at least one compound, including polymers, that has one or more triarylamine moieties with formula 1:

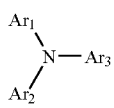

where $Ar_1$, $Ar_2$, and $Ar_3$ are substituted or unsubstituted aryl or arylene functional groups and where, optionally, the triarylamine moiety(ies) is/are coupled to other portions of the compound through one or more of the arylene functional groups, if present. Examples of suitable materials include triphenylamine and biphenyldiamines such as, for example, N,N'-bis(naphthalene-2-yl)-N,N'-bis(phenyl)benzidine (NPD), N,N'-bis(3-methylphenyl)-N,N'-bis(phenyl)benzidine (TPD), and 4,4'-bis(carbazol-9-yl)biphenyl (CPB).

Other examples include triarylamine compounds with tetrahedral cores such as compounds having formulas 2, 3, and 4:

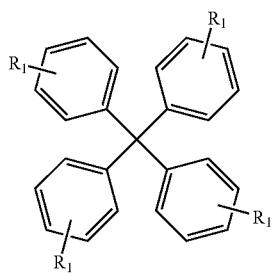

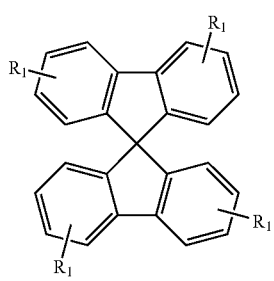

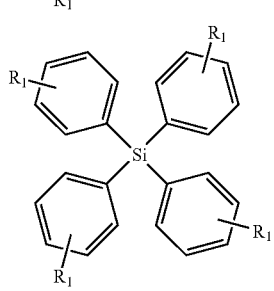

where each $R_1$ is independently selected (i.e., each $R_1$ can be the same or different from the other $R_1$ substituents in the formula) from triarylamine moieties (including moieties which form a triarylamine structure in combination with the phenyl group to which $R_1$ is attached). Examples of suitable triarylamine moieties for $R_1$ include formulas 5, 6, 7, and 8:

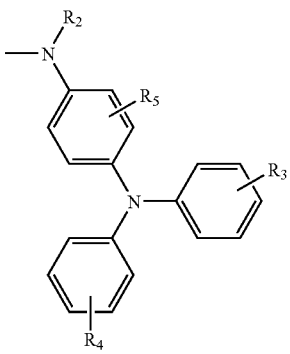

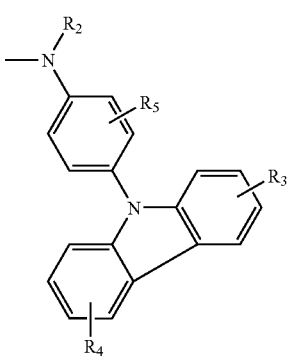

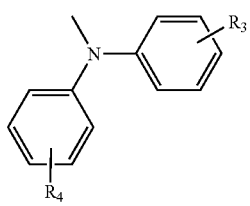

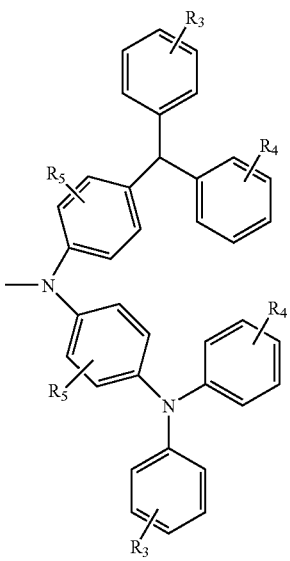

where $R_2$ is alkyl or aryl and each $R_3$, $R_4$, and $R_5$ is independently H, alkyl, aryl, alkoxy, aryloxy, halo, alkylthio, arylthio, or —$NR_aR_b$, where $R_a$ and $R_b$ are aryl or alkyl. With respect to Formula 8, in some embodiments, all $R_3$ are the same, all $R_4$ are the same, all $R_5$ are the same, or any combination thereof (e.g., all $R_3$ and $R_4$ are the same). Each aryl or alkyl portion of any of these substituents can be substituted or unsubstituted including, for example, fluorinated and perfluorinated alkyls.

In some embodiments, the triarylamine material preferably incorporates one or more arylenediamine linkages of the formula 9:

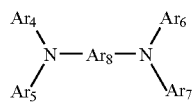

9 where $Ar_4$, $Ar_5$, $Ar_6$, $Ar_7$, and $Ar_8$ are substituted or unsubstituted aryl or arylene groups and where, optionally, the arylenediamine linkage(s) is/are coupled to other portions of the compound through one or more of the arylene functional groups, if present. One preferred arylenediamine linkage is a phenylenediamine linkage where $Ar_8$ is a phenylene group. Examples of suitable compounds of this type include those compounds illustrated in Formulas 10–12:

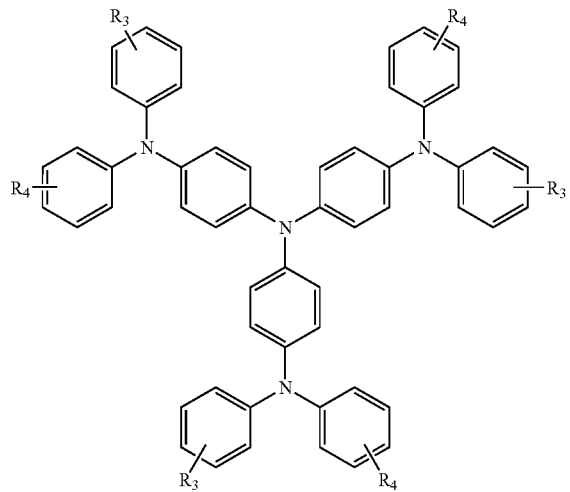

10

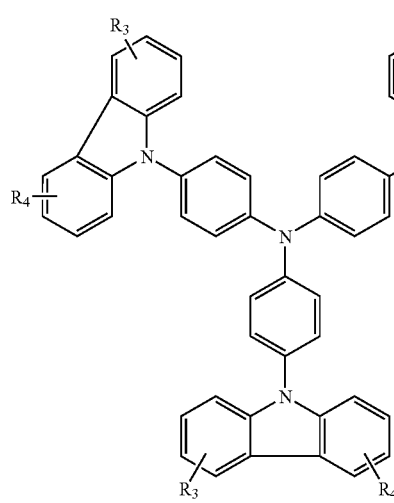

11

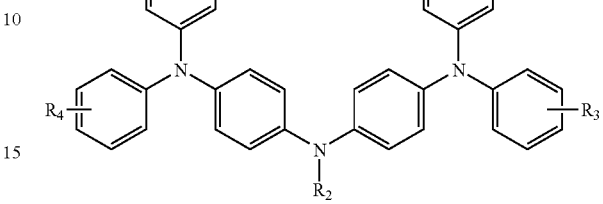

12 where each $R_2$ is independently alkyl or aryl and each $R_3$ and $R_4$ is independently H, alkyl, aryl, alkoxy, aryloxy, arylthio, alkylthio, halo, or —$NR_aR_b$, where $R_a$ and $R_b$ are aryl or alkyl. Each aryl or alkyl portion of any of these substituents can be substituted or unsubstituted. In some embodiments, one of the following conditions applies: all of the $R_3$ and $R_4$ substituents are the same; all of the $R_3$ substituents are the same; all of the $R_4$ substituents are the same; or all of the $R_3$ substituents and all of the $R_4$ substituents are the same, but $R_3$ and $R_4$ are different.

Specific examples of suitable compounds of this type include 4,4',4"-tris(N,N-diphenylamino)triphenylamine (TDATA) (Formula 13), 4,4',4"-tris(N-3-methylphenyl-N-phenylamino)triphenylamine (MTDATA) (Formula 14), 4,4',4"-tris(carbozol-9-yl)triphenylamine (TCTA) (Formula 15), 4,4',4"-tris(N-naphthyl-N-phenylamino)triphenylamine (2-TNATA) (Formula 16):

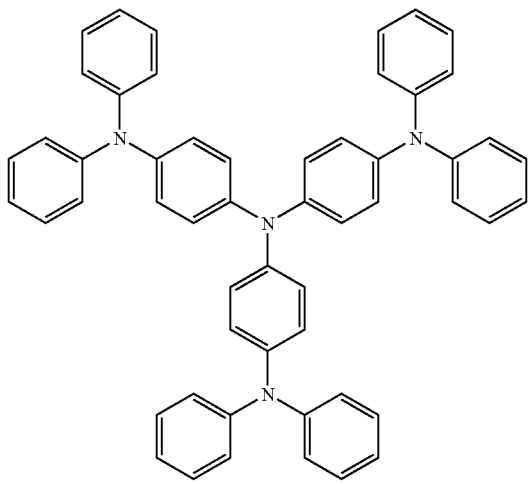

13

-continued

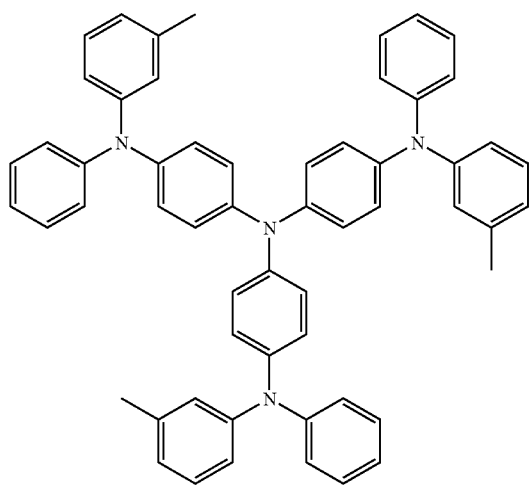

14

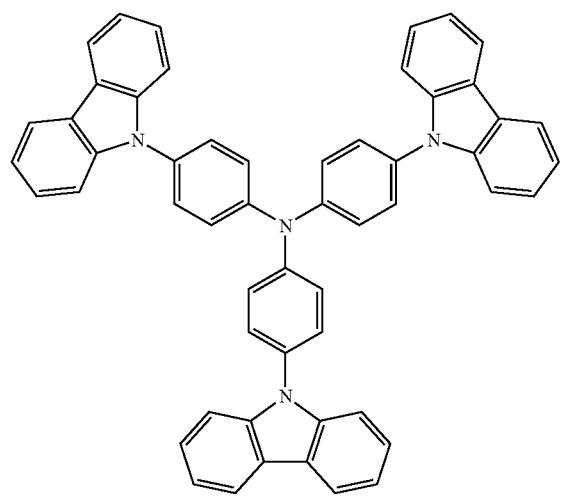

16

Another example is Formula 17 where each X is independently O or S (and preferably all of the X substituents are the same).

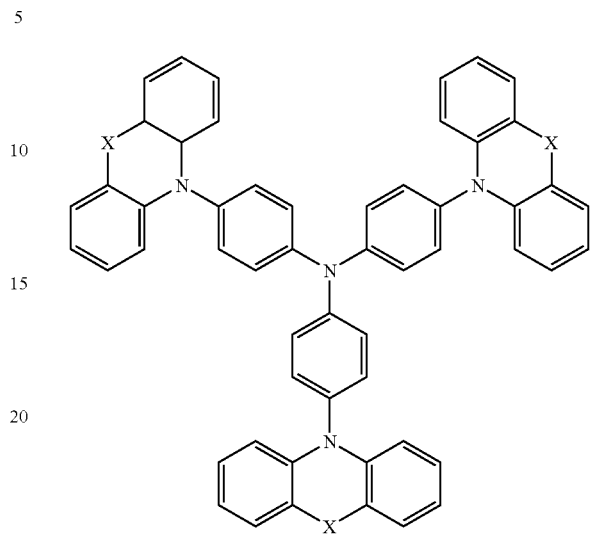

17

As an alternative to small molecule triarylamine materials, polymeric materials with triarylamine moieties can be used. The triarylamine moieties can be in the backbone of the polymeric material, can be pendent groups extending from the backbone of the polymeric material, or both. Polymers with triarylamine moieties in the backbone include, for example, the polymers of Formulas 18, 19, 20, and 21:

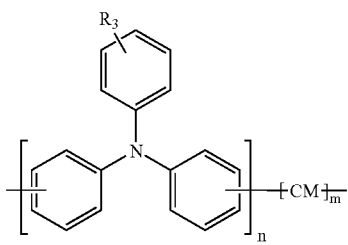

18

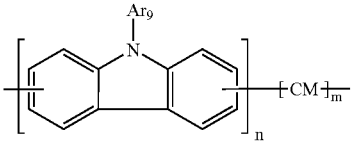

19

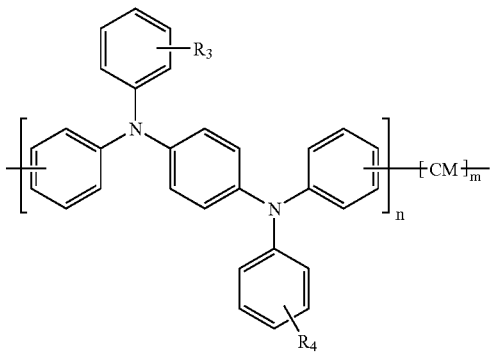

20

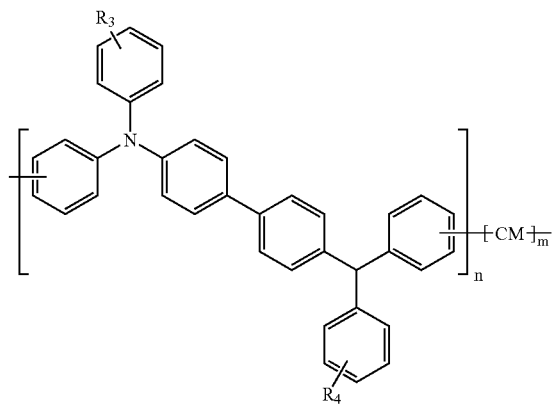

21 where $R_3$ and $R_4$ are independently H, alkyl, aryl, alkoxy, aryloxy, arylthio, alkylthio, halo, or $-NR_aR_b$, where $R_a$ and $R_b$ are aryl or alkyl, $Ar_9$ is aryl or arylene, CM is one or more comonomers, n is an integer of three or greater and preferably 10 or greater, and m is an integer of zero or greater. Each aryl or alkyl portion of any of these substituents can be substituted or unsubstituted. Suitable comonomers, CM, include, for example, another triarylamine-containing monomer such as those illustrated in Formulas 18–21 or 33–34 below, arylene (including substituted or unsubstituted para- or meta-phenylene), substituted or unsubstituted styrene comonomers, derivatized carbazole comonomers (such as N-alkyl carbazole or N-aryl carbazole, for example, the comonomers as illustrated in Formulas 29 and 32), ether-and polyether-linked comonomers, carbonate comonomers, urethane-linked comonomers, thioether-linked comonomers, ester-linked comonomers, and imide-and amide-linked comonomers. Examples of such comonomers include, but are not limited to, $-O-(C_nH_{2n}O)-$ and $-Ar_{10}-O-(C_nH_{2n}O)-Ar_{11}-$ where $Ar_{10}$ and $Ar_{11}$ are arylene.

In some instances, the comonomer contains one or more photo- or thermocrosslinking functional groups, such a benzocyclobutene (Formula 22) or acrylate or methacrylate groups, such as, for example, the acrylate group of Formula 23.

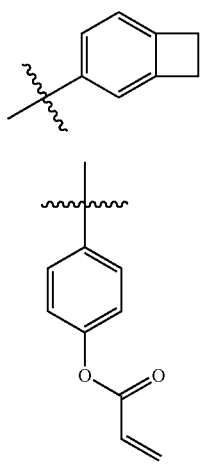

22

23

Other examples of cross-linkable moieties are described in, for example, PCT patent application Publication No. WO 97/33193, incorporated herein by reference. In some embodiments, the polymers containing such cross-linkable moieties are selected to crosslink under relatively mild photochemical or thermal conditions. For example, thermal crosslinking may occur at 100 to 150° C. Alternatively, UV-visible radiation in the range of 300 to 700 nm might be used to crosslink the polymers.

Typically the comonomer is copolymerized with the triarylamine-containing monomer unit. However, in some instances, the comonomer can be coupled to the triarylamine-containing monomer unit prior to polymerization. Such a polymer might not be considered a copolymer, but rather a homopolymer with the coupled triarylamine-containing unit/comonomer unit as the basic monomer unit of the polymer. Examples of such polymers are illustrated by Formulas 24–27.

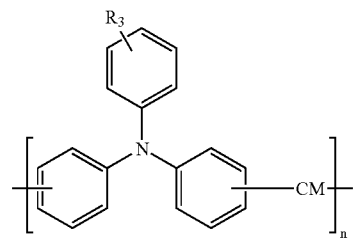

24

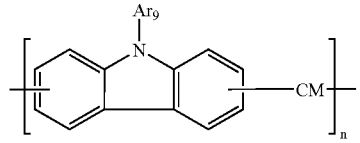

25

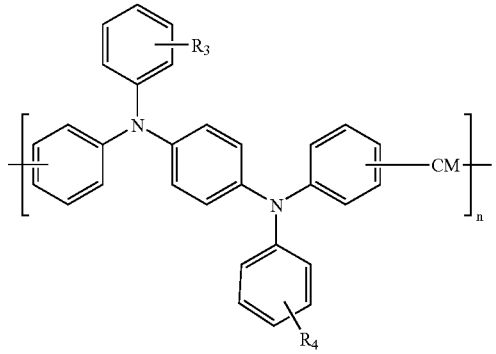

26

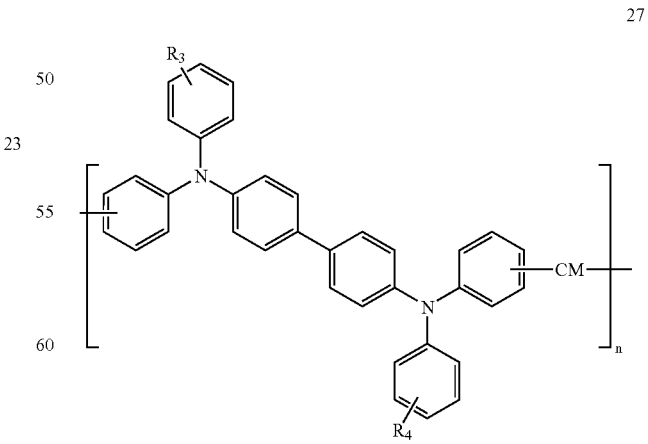

27

Specific examples of the polymers of Formulas 24–27 include the polymers of Formulas 28–32:

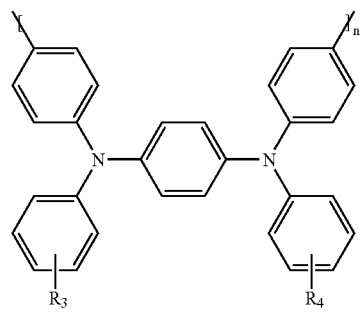
28
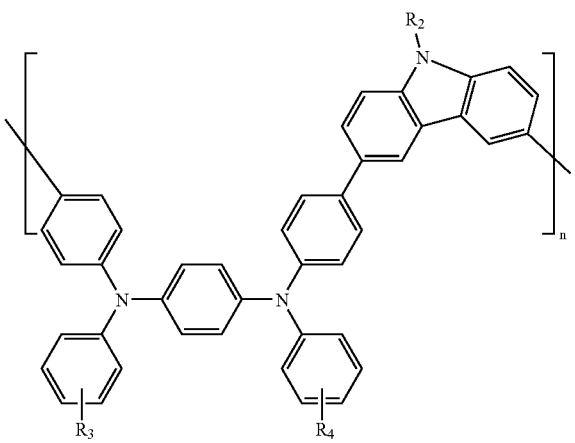
29
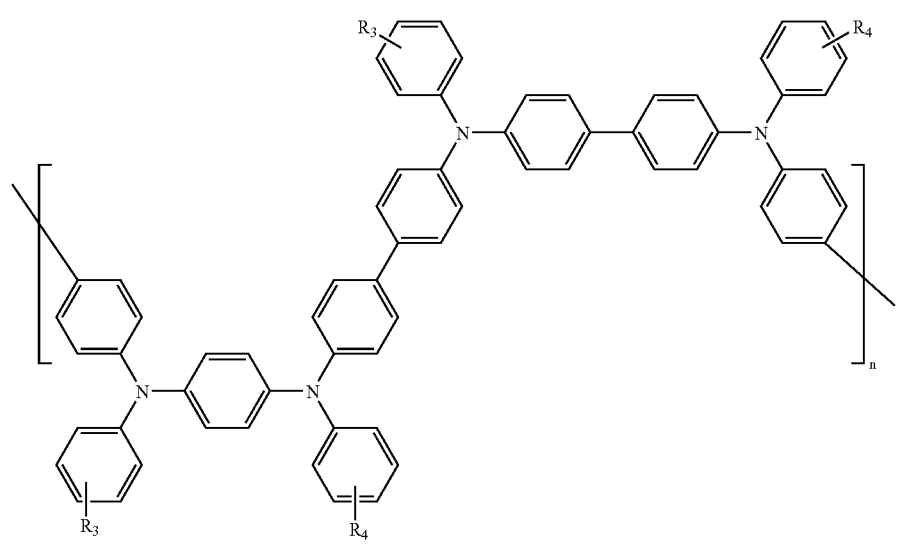
30
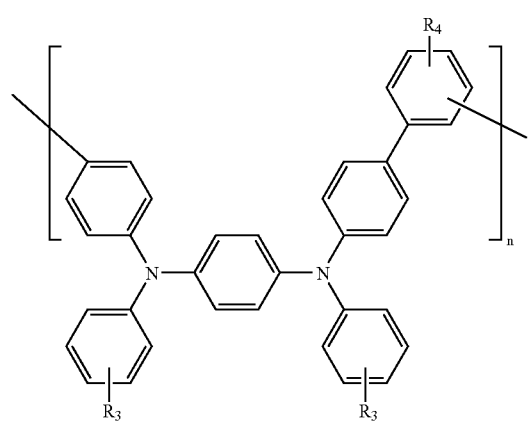
31

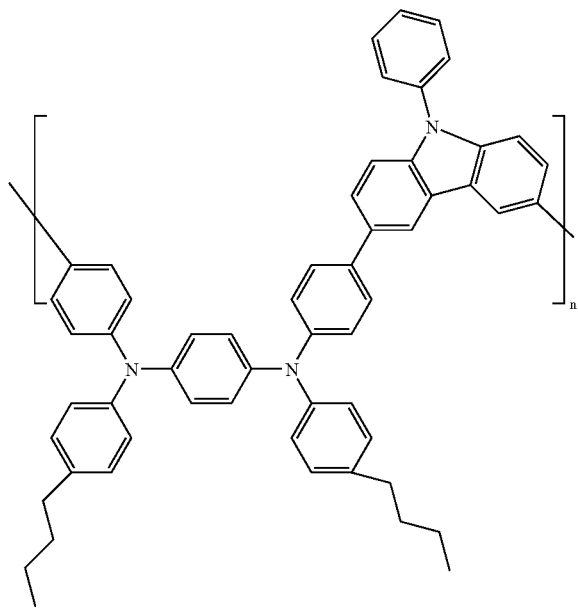

32

In Formulas 29–32, the comonomer unit is coupled to the triarylamine moiety-containing monomer unit in such a way that the two monomer units alternate in the polymer.

Formulas 33 and 34 illustrate polymers with triarylamine pendent groups:

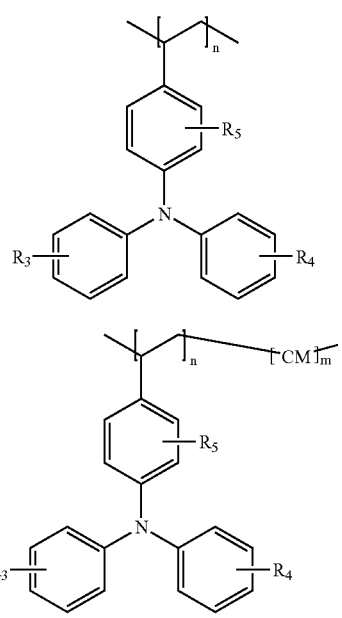

33

34 where $R_3$, $R_4$, and $R_5$ are independently H, alkyl, aryl, alkoxy, aryloxy, arylthio, alkylthio, halo, or $-NR_aR_b$, where $R_a$ and $R_b$ are aryl or alkyl, CM is one or more comonomers, n is an integer of three or greater and preferably 10 or greater, and m is an integer of zero or greater. Each aryl or alkyl portion of any of these substituents can be substituted or unsubstituted. Suitable comonomers, CM, include, for example, another triarylamine-containing monomer containing one or more chain polymerizable moieties, arylenes (including substituted or unsubstituted para- or meta-phenylene) with one or more chain polymerizable moieties, derivatized carbazole comonomers (such as N-vinyl carbazole), carbonate comonomers, urethane-linked comonomers, thioether-linked comonomers, ester-linked comonomers, imide-and amide-linked comonomers, substituted or unsubstituted styrene comonomers, (meth)acrylate comonomers of, for example, C1–C12 alcohols, diene comonomers such as, for example, butadiene, isoprene and 1,3 cyclohexadiene, and other chain-polymerizable comonomers.

Typically the comonomer is copolymerized with the triarylamine-containing monomer unit. However, in some instances, the comonomer can be coupled to the triarylamine-containing monomer unit prior to polymerization. Such a polymer might not be considered a copolymer, but rather a homopolymer with the coupled triarylamine-containing unit/comonomer unit as the basic monomer unit of the polymer. One example is illustrated as Formula 35.

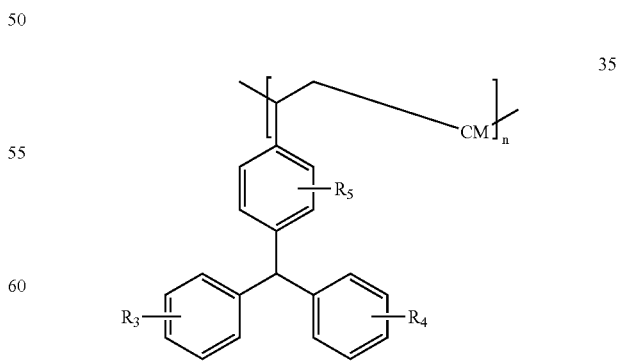

35

It will be understood that the pendent groups can also extend from backbone moieties other than the ethylene moieties illustrated in Formulas 33 and 34. Examples of other backbone units from which the triarylamine pendent groups can extend include, for example, alkylene (such as propylene, butylenes, isoprene, or 1,3-cyclohexadiene), silane, arylenes (including substituted or unsubstituted para- or meta-phenylene), derivatized carbazole monomers (as illustrated in Formulas 29 and 32), carbonate monomers, urethane-linked monomers, thioethers-linked monomers, ester-linked monomers, imide- and amide-linked monomers, substituted and unsubstituted styrene monomers, and (meth) acrylate monomers. The triarylamine may not be directly attached to the backbone, but may be separated from the backbone by a spacer group such as, for example, an alkylene group (e.g., methylene or ethylene), alkenylene (e.g., —(CH=CH)$_n$—, n=1–6), alkynylene (e.g., —(C≡C)$_n$—, n=1–6), arylene, an alkyl ether (e.g., —CH$_2$—O—) group, or any combination of these groups.

Specific examples of suitable polymers with pendent triarylamine groups include, for example, the polymers of Formulas 36–38:

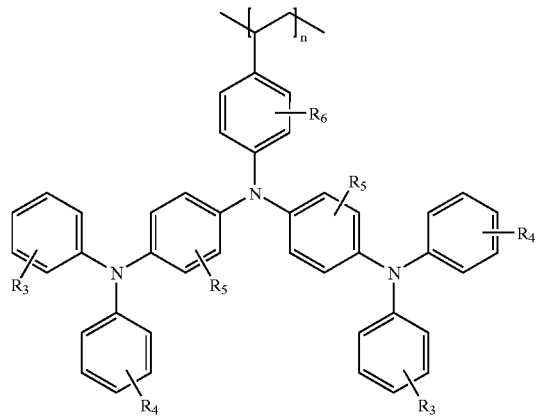

36

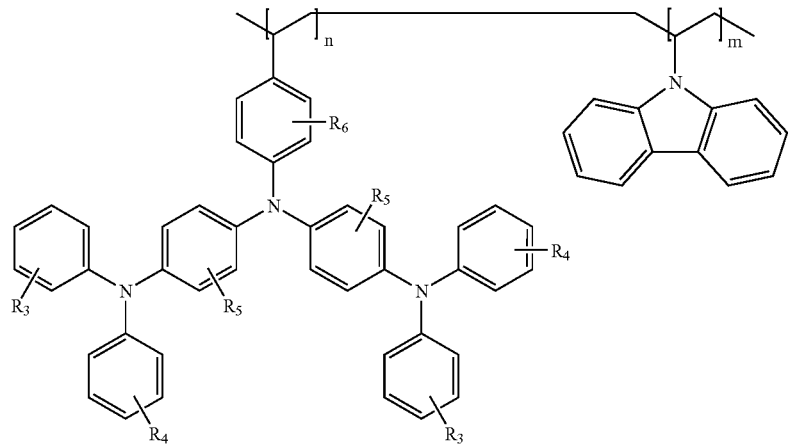

37

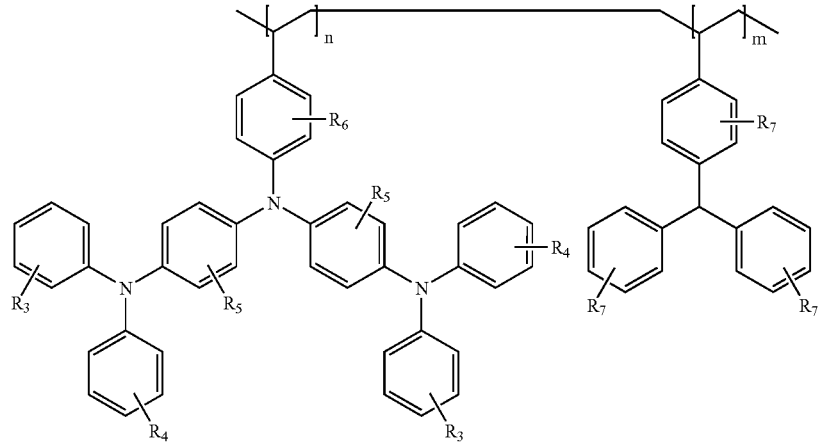

38 where each $R_3$, $R_4$, $R_5$, $R_6$, and $R_7$ is independently H, alkyl, aryl, alkoxy, aryloxy, arylthio, alkylthio, halo, or —$NR_aR_b$, where $R_a$ and $R_b$ are aryl or alkyl. Each aryl or alkyl portion of any of these substituents can be substituted or unsubstituted. In some embodiments, one or more of the following conditions applies: all of the $R_3$, $R_4$, and $R_5$ substituents are the same; all of the $R_3$ substituents are the same; all of the $R_4$ substituents are the same; all of the $R_5$ substituents are the same; all of the $R_7$ substituents are the same; or all of the $R_3$ substituents and all of the $R_4$ substituents are the same, but $R_3$ and $R_4$ are different. For example, $R_3$, $R_5$, $R_6$, and $R_7$ can be H and $R_4$ can be methyl in any of Formulas 36–38.

Unless otherwise indicated, the term "alkyl" includes both straight-chained, branched, and cyclic alkyl groups and includes both unsubstituted and substituted alkyl groups. Unless otherwise indicated, the alkyl groups are typically C1–C20. Examples of "alkyl" as used herein include, but are not limited to, methyl, ethyl, n-propyl, n-butyl, n-pentyl, isobutyl, and isopropyl, and the like.

Unless otherwise indicated, the term "aryl" refers to monovalent unsaturated aromatic carbocyclic radicals having one to fifteen rings, such as phenyl or bipheynyl, or multiple fused rings, such as naphthyl or anthryl, or combinations thereof. Examples of aryl as used herein include, but are not limited to, phenyl, 2-naphthyl, 1-naphthyl, biphenyl, 2-hydroxyphenyl, 2-aminophenyl, 2-methoxyphenyl and the like.

Unless otherwise indicated, the term "arylene" refers to divalent unsaturated aromatic carbocyclic radicals having one to fifteen rings, such as phenylene, or multiple fused rings, such as fluorene, naphthylene or anthrylene, or combinations thereof. Examples of "arylene" as used herein include, but are not limited to, benzene-1,2-diyl, benzene-1,3-diyl, benzene-1,4-diyl, naphthalene-1,8-diyl, anthracene-1,4-diyl, fluorene, phenylenevinylene, phenylenedivinylene, and the like.

Unless otherwise indicated, the term "alkoxy" refers to the functional group —OR where R is a substituted or unsubstituted alkyl group. Unless otherwise indicated, the alkyl group is typically C1–C20. Examples of "alkoxy" as used herein include, but are not limited to, methoxy, ethoxy, n-propoxy, and 1-methylethoxy, and the like.

Unless otherwise indicated, the term "aryloxy" refers to the functional group —OAr where Ar is a substituted or unsubstituted aryl group. Examples of "aryloxy" as used herein include, but are not limited to, phenyloxy, naphthyloxy, and the like.

Suitable substituents for substituted alkyl, aryl, and arylene groups include, but are not limited to, alkyl, alkylene, aryl, arylene, heteroaryl, heteroarylene, alkenyl, alkenylene, —NRR', F, Cl, Br, I, —OR, —SR, cyano, nitro, —COOH, and —COO-alkyl where R and R' are independently hydrogen, alkyl, or aryl.

Unless otherwise indicated, the term "halo" includes fluoro, chloro, bromo, and iodo.

Unless otherwise indicated, the term "polymer" includes homopolymers and copolymers including block copolymers and random copolymers.

In addition to the triarylamine material, the buffer layer also includes an electron acceptor material to improve electron transport. Preferably, such compounds have relatively high electron affinity and relatively low energy of the lowest unoccupied molecular orbital (LUMO). Suitable electron acceptor materials include electron deficient compounds such as, for example, tetracyanoquinodimethane and derivatives, thiopyranylidines, polynitrofluorenones, tetracyanoethylene (TCNE), chloranil, and other compounds commonly used as electron acceptors in charge transfer materials and electrophotography. Specific examples of electron acceptor materials include tetracyanoquinodimethane (TCNQ) (Formula 39), tetrafluoro-tetracyanoquinodimethane ($F_4$-TCNQ) (Formula 40), tetracyanoethylene, chloranil, 2-(4-(1-methylethyl)phenyl-6-phenyl-4H-thiopyran-4-ylidene)-propanedinitrile-1,1-dioxyide (PTYPD) (Formula 41), and 2,4,7-trinitrofluorenone (Formula 42).

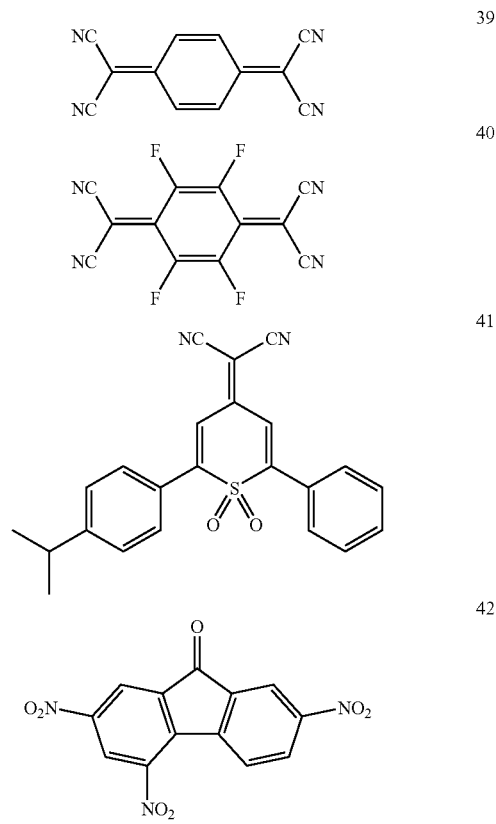

Preferably, the electron acceptor material is soluble in one or more organic solvents, more preferably, one or more organic solvents in which the triarylamine material is also soluble. Typically, the electron donor material is present in the buffer layer in the range of 0.5 to 20 wt. % of the triarylamine material. In some embodiments, the electron donor material is present in the buffer layer in the range of 1 to 5 wt. % of the triarylamine material.

The buffer layer optionally includes a polymeric binder. The polymeric binder can include inert or electroactive polymers or combinations thereof. Suitable polymers for the polymeric binder include, for example, polystyrene, poly(N-vinyl carbazole), polyfluorenes, poly(para-phenylenes), poly(phenylenevinylenes), polycarbonates, polyimides, polyolefins, polyacrylates, polymethacrylates (for example, poly(methylmethacrylate)), polyethers, polysulfones, polyether ketones, and copolymers or mixtures thereof. If the triarylamine material includes a triarylamine-containing polymer, that polymer can act as or in cooperation with a polymeric binder, if desired. If used, the polymeric binder is typically provided in the range of 20 to 150 wt. %, preferably 70 to 120 wt. %, of the triarylamine material.

In some embodiments, the polymeric binder can be photochemically or thermally crosslinked with itself or with other components in the buffer layer. Accordingly, a thermochemical or photochemical crosslinking agent, such as, for example, 2,6-bis(4-azidobenzylidene)-4-methylcyclohexanone, can optionally be included in the buffer layer. Crosslinking can be desirable for one or more purposes, such as decreasing the migration of buffer layer components out of the buffer layer, decreasing the migration of other materials into the buffer layer, increasing thermal stability, increasing mechanical stability, increasing morphological stability, increasing buffer layer stability, and increasing layer integrity, particularly during further solution processing. Crosslinking the buffer layer can also facilitate manufacture of a device by providing a buffer layer upon which other layers can be solution coated or cast with substantially less concern about dissolving the buffer layer.

The buffer layer can optionally include a color converting material. This material can be a luminescent or non-luminescent organic, organometallic, or inorganic compound or combinations thereof. The color converting material changes the color of electroluminescence from an emitting layer by selective absorption of light or by absorption of light and re-emission of the light in a different spectral range. Suitable materials include, for example, dyes, pigments, and nanoparticles. Examples of suitable non-luminescent and luminescent dyes include: azo dyes (e.g. C.I. Direct Green 26 and others), anthraquinone dyes (e.g. C.I. Reactive Blue 4 and others), indigoid dyes (e.g. Tyrian Purple and others), triphenylmethane-based dyes (e.g. Eosin and others), coumarin dyes (e.g. Coumarin 6 and others), metal porphyrins (e.g. platinum [II] octaethylporphyrin and others), cyclometalated transition metal complexes (e.g. iridium tris(2-phenylpyridine) and others), and other dyes including those discussed in H. Zollinger, *Color Chemistry*, 1991, VCH Publishers: New York, and *The Chemistry and Application of Dyes*, Ed. By D. R. Waring and G. Halls, 1990, Plenum Press: New York, both of which are incorporated herein by reference. Examples of nanoparticles suitable for color conversion can be found in M. Bruchez et al., Science 281, 2013 (1998), incorporated herein by reference. The color converting material can be polymeric with color converting moieties in the backbone, on pendant chains, or both. The color converting material, if used, is typically included in the buffer layer in an amount in the range of 0.1 to 100 wt. %, preferably 0.1 to 10 wt. %, of the triarylamine material.

The buffer layer can also optionally include scattering material, such as small particles, nanocrystals, or clusters. Examples of suitable materials include clays, oxides, metals, and glasses. Specific examples of suitable materials include titania, alumina and silica powders having a mean particle size of approximately 0.05 to 0.2 microns, and added to the buffer layer composition in a concentration of from 0.1 to 20% by weight, and preferably from about 1–5% by weight.

The buffer layer 254 is formed by solution coating the material of the buffer layer onto the substrate 250. After formation of the buffer layer 254, additional layers, such as the hole transport layer 260 or emission layer 256, can be formed on the buffer layer by a variety of techniques including, for example, solution coating, physical or chemical vapor deposition, and thermal transfer, including light-induced thermal transfer as described below.

An organic solvent is used to make the solution for the buffer layer. Examples of suitable organic solvents include carbon tetrachloride, toluene, chloroform, 1,2-dichloroethane, 1,2-dichlorobenzene, tetrahydrofuran, pyridine, and the like. The remaining materials of the buffer layer are typically dispersible or, preferably, soluble in the organic solvent.

In some conventional device formation methods, layers are formed using solutions of components in water. A drawback of these methods is that some of the device materials are degraded in the presence of water or irreversible physical changes may occur leading to device degradation. Thus, if a layer is formed using a water solution, the water generally must be completely removed. On the other hand according to the invention, organic solvents can be chosen that are easier to remove or do not degrade materials in the device or both.

In other conventional device formation methods, the materials of a layer are disposed by vapor deposition. A number of materials are difficult to accurately and consistently deposit by vapor deposition methods. Included in these materials are a variety of polymers and ionic compounds. Thus, it can be difficult to deposit materials such as a polymeric binder and cross-linking agent using vapor deposition techniques. In addition, the consistency and uniformity of a vapor deposited composition becomes increasingly difficult when the composition contains multiple components. On the other hand according to the invention, forming a buffer layer by solution coating can facilitate the use of materials such as polymeric binders, polymeric triarylamine materials, cross-linking agents, dyes, pigments, scattering particles, and so on. In addition, the coating technique permits the use of multi-component systems when all of the components are soluble or dispersible in the solvent.

As an alternative to solution coating the buffer layer material directly onto the substrate or depositing the buffer layer material using ink jet techniques, the buffer layer material can be coated onto a donor sheet and then transferred by techniques such as thermal transfer to the substrate. This can be particularly useful for patterning the buffer layer onto the substrate. For example, the buffer layer material can be selectively transferred from the donor sheet to the substrate according to a pattern by selective application of, for example, light or heat to the donor sheet. This can be useful, for example, to pattern individual buffer layers with a different color converting materials (or lack of color converting material) onto the substrate. Thus, a full-color display could be formed using, for example, three different buffer layers with three different color converting materials (or two different color converting materials and the third buffer layer lacking a color converting material). Other methods of selectively patterning color converting materials in buffer layer(s) include, for example, thermal diffusion of the color converting material, inkjet transfer of the buffer material with (or without) color converting materials onto the substrate, and selective photobleaching.

Suitable thermal transfer methods for transferring a buffer layer or other device layers to the substrate or onto a previously-formed buffer layer include, for example, thermal head transfer methods and light-induced thermal transfer methods. The presence of the buffer layer on the substrate can, at least in some instances, facilitate the transfer of other layers to the substrate by these methods. Materials, layers, or other structures can be selectively transferred from the transfer layer of a donor sheet to a receptor substrate by placing the transfer layer of the donor element adjacent to the receptor and selectively heating the donor element. For example, the donor element can be selectively heated by irradiating the donor element with imaging radiation that can be absorbed by light-to-heat converter material disposed in the donor, often in a separate light-to-heat conversion (LTHC) layer, and converted into heat. Examples of such methods, donor elements and receptors, as well as articles and devices that can be formed using thermal transfer, can be found in U.S. Pat. Nos. 5,521,035, 5,691,098, 5,693,446, 5,695,907, 5,710,097, 5,725,989, 5,747,217, 5,766,827, 5,863,860, 5,897,727, 5,976,698, 5,981,136, 5,998,085, 6,057,067, 6,099,994, 6,114,088, 6,140,009, 6,190,826, 6,194,119, 6,221,543, 6,214,520, 6,221,553, 6,228,543, 6,228,555, 6,242,152, 6,270,934, and 6,270,944 and PCT patent applications Publication Nos. WO 00/69649 and WO 01/39986 and U.S. patent applications Ser. Nos. 09/662,845, 09/662,980, 09/844,100, and 09/931,598, all of which are incorporated herein by reference. The donor can be exposed to imaging radiation through the donor substrate, through the receptor, or both. The radiation can include one or more wavelengths, including visible light, infrared radiation, or ultraviolet radiation, for example from a laser, lamp, or other radiation source.

Other selective heating methods can also be employed, such as using a thermal print head or using a thermal hot stamp (e.g., a patterned thermal hot stamp such as a heated silicone stamp that has a relief pattern that can be used to selectively heat a donor). Thermal print heads or other heating elements may be particularly suited for making lower resolution patterns of material or for patterning elements whose placement need not be precisely controlled.

Material from the transfer layer can be selectively transferred to a receptor in this manner to imagewise form patterns of the transferred material on the receptor. In many instances, thermal transfer using light from, for example, a lamp or laser, to patternwise expose the donor can be advantageous because of the accuracy and precision that can often be achieved. The size and shape of the transferred pattern (e.g., a line, circle, square, or other shape) can be controlled by, for example, selecting the size of the light beam, the exposure pattern of the light beam, the duration of directed beam contact with the donor sheet, or the materials of the donor sheet. The transferred pattern can also be controlled by irradiating the donor element through a mask.

Transfer layers can also be transferred from donor sheets without selectively transferring the transfer layer. For example, a transfer layer can be formed on a donor substrate that, in essence, acts as a temporary liner that can be released after the transfer layer is contacted to a receptor substrate, typically with the application of heat or pressure. Such a method, referred to as lamination transfer, can be used to transfer the entire transfer layer, or a large portion thereof, to the receptor.

A donor sheet for light-induced thermal transfer can include, for example, a donor substrate, an optional underlayer, an optional light-to-heat conversion (LTHC) layer, an optional interlayer, and a transfer layer. The donor substrate can be a polymer film or any other suitable, preferably transparent, substrate. The donor substrate is also typically selected from materials that remain stable despite heating of one or more layers of the donor. However, the inclusion of an underlayer between the substrate and an LTHC layer can be used to insulate the substrate from heat generated in the LTHC layer during imaging.

The underlayer can include materials that impart desired mechanical or thermal properties to the donor element. For example, the underlayer can include materials that exhibit a low value for the mathematical product of specific heat and density or low thermal conductivity relative to the donor substrate. Such an underlayer may be used to increase heat flow to the transfer layer, for example to improve the imaging sensitivity of the donor. The underlayer can also include materials for their mechanical properties or for adhesion between the substrate and the LTHC.

An LTHC layer can be included in donor sheets of the present invention to couple irradiation energy into the donor sheet. The LTHC layer preferably includes a radiation absorber that absorbs incident radiation (e.g., laser light) and converts at least a portion of the incident radiation into heat to enable transfer of the transfer layer from the donor sheet to the receptor.

An optional interlayer can be disposed between the LTHC layer and transfer layer. The interlayer can be used, for example, to minimize damage and contamination of the transferred portion of the transfer layer and may also reduce distortion in the transferred portion of the transfer layer. The interlayer can also influence the adhesion of the transfer layer to the rest of the donor sheet. Typically, the interlayer has high thermal resistance. Preferably, the interlayer does not distort or chemically decompose under the imaging conditions, particularly to an extent that renders the transferred image non-functional. The interlayer typically remains in contact with the LTHC layer during the transfer process and is not substantially transferred with the transfer layer.

The interlayer can provide a number of benefits, if desired. The interlayer can be a barrier against the transfer of material from the light-to-heat conversion layer. It can also modulate the temperature attained in the transfer layer so that thermally unstable materials can be transferred. For example, the interlayer can act as a thermal diffuser to control the temperature at the interface between the interlayer and the transfer layer relative to the temperature attained in the LTHC layer. This can improve the quality (i.e., surface roughness, edge roughness, etc.) of the transferred layer. The presence of an interlayer can also result in improved plastic memory in the transferred material.

The thermal transfer layer includes the buffer material to form the buffer layer, if desired, or appropriate materials to form other layers depending on the desired thermal transfer. For example, other layers of the device, such as the hole transport layer or the emission layer, can be transferred onto the substrate or onto the buffer layer or other layers disposed on the substrate by these methods. Such transfer can be sequential using multiple donor sheets or, in some embodiments, multiple layers can be transferred using a single donor sheet with the transfer layer having individual sublayers.

Figure 5:
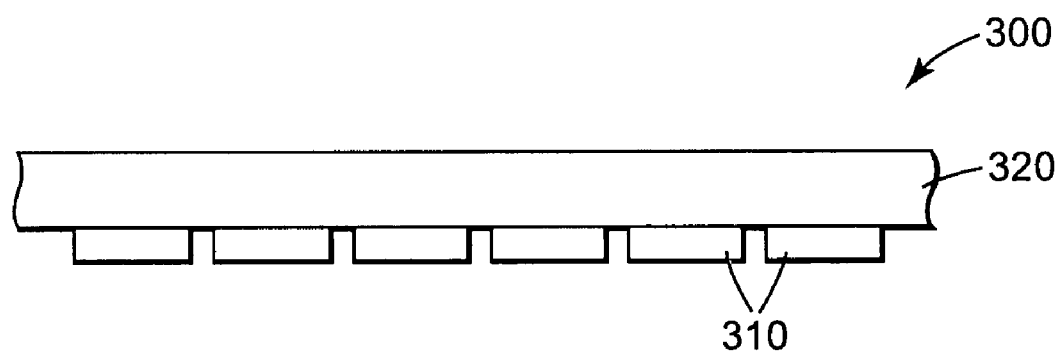
FIG. 5 is a schematic side view of an organic electroluminescent display according to the present invention.

The present invention contemplates light emitting OEL displays and devices. In one embodiment, OEL displays can be made that emit light and that have adjacent devices that can emit light having different color. For example, FIG. 5 shows an OEL display 300 that includes a plurality of OEL devices 310 disposed on a substrate 320. Adjacent devices 310 can be made to emit different colors of light.

The separation shown between devices 310 is for illustrative purposes only. Adjacent devices may be separated, in contact, overlapping, etc., or different combinations of these in more than one direction on the display substrate. For example, a pattern of parallel striped transparent conductive anodes can be formed on the substrate followed by a striped pattern of a hole transport material and a striped repeating pattern of red, green, and blue light emitting LEP layers, followed by a striped pattern of cathodes, the cathode stripes oriented perpendicular to the anode stripes. Such a construction may be suitable for forming passive matrix displays. In other embodiments, transparent conductive anode pads can be provided in a two-dimensional pattern on the substrate and associated with addressing electronics such as one or more transistors, capacitors, etc., such as are suitable for making active matrix displays. Other layers, including the light emitting layer(s) can then be coated or deposited as a single layer or can be patterned (e.g., parallel stripes, two-dimensional pattern commensurate with the anodes, etc.) over the anodes or electronic devices. Any other suitable construction is also contemplated by the present invention.

In one embodiment, display 300 can be a multiple color display. As such, it may be desirable to position optional polarizer 330 between the light emitting devices and a viewer, for example to enhance the contrast of the display. In exemplary embodiments, each of the devices 310 emits light. There are many displays and devices constructions covered by the general construction illustrated in FIG. 3. Some of those constructions are discussed as follows.

OEL backlights can include emissive layers. Constructions can include bare or circuitized substrates, anodes, cathodes, hole transport layers, electron transport layers, hole injection layers, electron injection layers, emissive layers, color changing layers, and other layers and materials suitable in OEL devices. Constructions can also include polarizers, diffusers, light guides, lenses, light control films, brightness enhancement films, and the like. Applications include white or single color large area single pixel lamps, for example where an emissive material is provided by thermal stamp transfer, lamination transfer, resistive head thermal printing, or the like; white or single color large area single electrode pair lamps that have a large number of closely spaced emissive layers patterned by laser induced thermal transfer; and tunable color multiple electrode large area lamps.

Low resolution OEL displays can include emissive layers. Constructions can include bare or circuitized substrates, anodes, cathodes, hole transport layers, electron transport layers, hole injection layers, electron injection layers, emissive layers, color changing layers, and other layers and materials suitable in OEL devices. Constructions can also include polarizers, diffusers, light guides, lenses, light control films, brightness enhancement films, and the like. Applications include graphic indicator lamps (e.g., icons); segmented alphanumeric displays (e.g., appliance time indicators); small monochrome passive or active matrix displays; small monochrome passive or active matrix displays plus graphic indicator lamps as part of an integrated display (e.g., cell phone displays); large area pixel display tiles (e.g., a plurality of modules, or tiles, each having a relatively small number of pixels), such as may be suitable for outdoor display used; and security display applications.

High resolution OEL displays can include emissive layers. Constructions can include bare or circuitized substrates, anodes, cathodes, hole transport layers, electron transport layers, hole injection layers, electron injection layers, emissive layers, color changing layers, and other layers and materials suitable in OEL devices. Constructions can also include polarizers, diffusers, light guides, lenses, light control films, brightness enhancement films, and the like. Applications include active or passive matrix multicolor or full color displays; active or passive matrix multicolor or full color displays plus segmented or graphic indicator lamps (e.g., laser induced transfer of high resolution devices plus thermal hot stamp of icons on the same substrate); and security display applications.

EXAMPLES

All chemicals are available from Aldrich Chemical Co., Milwaukee, Wis., unless otherwise indicated.

Preparation of ITO Substrates

For Examples 1–13, ITO substrates were prepared as follows: ITO (indium tin oxide) glass substrates (Applied Films Corporation, CO; ca. 25 Ω/sq.) were rinsed in acetone (Aldrich Chemical Company), dried with nitrogen, and rubbed with TX1010 Vectra Sealed-Border Wipers (ITW Texwipe, Upper Saddle River, N.J.) soaked in methanol (Aldrich Chemical Company, Milwaukee, Wis.), after which they were subjected to oxygen plasma treatment for four minutes at 200 mT (about 27 Pa) base oxygen pressure and output power of 50 W in Technics Micro Reactive Ion Etcher, Series 80 (K&M Company, CA). The OLED's described below were generally 1 to 1.5 $cm^2$ in size.

Comparative Example 1 and Examples 1–3

Buffer Layers Containing of Triarylamine Materials with Electrically Inert Polymers This Example describes the formation of OLEDs having a solution-processed hole-injecting buffer layer incorporating 4,4',4"-tris(N-3-methylphenyl-N-phenylamino)triphenylamine (MTDATA) as a triarylamine material, polystyrene (PS) as an electrically inert polymer binder, and tetrafluoro-tetracyanoquinodimethane ($F_4$-TCNQ) or tetracyanoquinodimethane (TCNQ) as an electron accepting dopant material.

The OLED is prepared by vapor depositing, onto an ITO substrate with a buffer layer, 20 nm of N,N'-bis(naphthan-2-yl)-N,N'-bis(phenyl)benzidine (NPD, H.W. Sands Corp., Jupiter, Fla.), followed by 30 nm of aluminum tris(8-hydroxyquinolate) (AlQ, H.W. Sands Corp, Jupiter, Fla.) doped with ca. 1 wt. % of green-emitting Coumarin 545T (C545T, Eastman Kodak Co., Rochester, N.Y.), and followed by 20 nm of AlQ. The OLED was capped with a cathode composed of ca. 0.7 nm of lithium fluoride (LiF, Alfa Aesar Co., Ward Hill, Mass.) and 200 nm of aluminum (Al, Alfa Aesar Co., Ward Hill, Mass.). In this OLED construction, the NPD layer acts as a hole-transport layer and electron-blocking layer, the layer of AlQ doped with C545T (AlQ:C545T) acts as a light emitting layer, and the layer of AlQ acts as an electron injection and transport layer. These OLED constructions are further referred to as "/NPD/AlQ:C545T/AlQ/LiF/Al".

All organic and cathode layers except the buffer layers were fabricated in a standard vacuum-deposition procedure at a base vacuum of ca. $10^{-7}$ to $10^{-5}$ torr (about $10^{-5}$ to $10^{-3}$ Pa) with evaporation rates of 0.05–0.2 nm/s for organic materials, 0.05 nm/s for LiF, and 1.5–2 nm/s for Al.

In Comparative Example 1, polypyrrole (PPY, Aldrich Chemical Co.) was used as a control hole-injecting buffer layer for purposes of comparison of the OLED behavior of the devices deposited onto PPY and onto doped triarylamine-based buffer layers. PPY was spun-coat from its water suspension after filtering the suspension through 0.2 μm Nylon microfilters, followed by annealing under nitrogen gas flow at 110° C. for ca. 15 min.

In Examples 1–4, OLEDs with buffer layers containing MTDATA, PS, and TCNQ were prepared and their performance evaluated along with that of the control PPY-based OLEDs. MTDATA, PS, and TCNQ were purchased from HWSands Corp. (Jupiter, Fla.), Polysciences Inc. (Eppelheim, Germany), and TCI America (Portland, Oreg.), respectively. The buffer layers were spun-coat from their ca. 1.5 wt. % solutions in toluene at the spin-rate of 2000 RPM (about 33 s$^{-1}$) to form ca. 90 nm thick films on the ITO coated substrates. The device structures are glass-ITO/buffer layer/NPD/AlQ:C545T/AlQ/LiF/Al. The buffers layers for the Examples are:

Comparative Example 1: PPY

Example 1: 31 wt. % PS, 62 wt. % MTDATA, and 7 wt. % TCNQ

Example 2: 47 wt. % PS, 46 wt. % MTDATA, and 7 wt. % TCNQ

Example 3: 62 wt. % PS, 31 wt. % MTDATA, and 7 wt. % TCNQ

No short-circuiting was observed in any of the studied electroluminescent lamps. For Examples 1–3, the OLEDs showed high operational efficiency and low operational voltages, with operational voltages decreasing with increasing triarylamine concentration.

Examples 5–6

Buffer Layers Containing Triarylamines and an Electroactive Polymer Binder

High bandgap hole-transporting poly(N-vinylcarbazole) (PVK, Polymer Source Inc., Dorval, Quebec) having relatively high oxidation potential (ca. 1V vs. SCE) and low hole mobility (ca. $10^{-6}$–$10^{-5}$ cm$^2$/V*s (about $10^{-1}$–$10^{-9}$ m$^2$ V s)) was used as an electroactive binder in the following buffer compositions: a) 60 wt. % PVK and 40 wt. % MTDATA, and b) 56 wt. % PVK, 37 wt. % MTDATA, and 7 wt. % F$_4$-TCNQ. These buffer layers were spun-coat from their ca. 1.5% wt. solutions in toluene at the spin-rate of 2000 RPM (about 33 s$^{-1}$) to form ca. 90 nm thick films on the ITO coated substrates.

OLED devices were made as described above for Comparative Example 1 and Examples 1–3, except that the buffer layers corresponded to:

Example 5: 60 wt. % PVK and 40 wt. % MTDATA

Example 6: 56 wt. % PVK, 37 wt. % MTDATA, and 7 wt. % F$_4$-TCNQ.

No short-circuiting was observed in any of the studied electroluminescent lamps. Luminance-voltage-current density screening of the OLEDs indicated that high efficiencies can be obtained in the composition including triarylamine-based buffers along with low operational voltages. Doping the PVK:MTDATA blend with F$_4$-TCNQ significantly lowered the operational voltage of the OLEDs. Operational lifetime studies on the triarylamine-based compositions, in which the OLEDs were driven at a constant current of ca. 1.8 mA/cm$^2$ (about 18 A/m$^2$) under inert atmosphere, show that projected operation lifetimes of these OLEDs extend into 10$^3$–10$^4$ hours range at an initial luminance of several hundred Cd/m$^2$.

Examples 7 and 8

Buffer Layers Containing Copolymers with Triarylamine Moieties Pendant to a Polyolefin Backbone In this Example, doped triarylamine buffer layers based on copolymers incorporating triarylamine moieties as a functionality pendant to a polyolefin backbone were incorporated into OLEDs.

A block co-polymer of styrene with diphenylaminostyrene (PS-pDPAS), having approximately 6:1 molar ratio of the monomers was synthesized and screened as a triarylamine-containing polymer.

All materials are available from Aldrich Chemical Co., Milwaukee, Wis., with the exception of p-diphenylaminostyrene, and as where noted. This monomer was synthesized by a preparation similar to that described by G. N. Tew, M. U. Pralle, and S. I. Stupp in *Angew. Chem. Int. Ed.,* 2000, 39, 517, incorporated herein by reference.

Synthesis of p-diphenylaminostyrene

To a mixture of 4-(diphenylamino)benzaldehyde (20.06 g, 73 mmol, Fluka Chemical Co., Milwaukee, Wis.), methyltriphenyl phosphonium bromide (26.22 g, 73 mmol) and dry tetrahydrofuran (450 mL) under nitrogen was added a 1M solution of potassium t-butoxide in tetrahydrofuran (80 mL, 80 mmol) over 5 minutes. The mixture was stirred for 17 hours at room temperature. Water (400 mL) was added and the tetrahydrofuran was removed under reduced pressure. The mixture was extracted with ether, and the combined organic layers were dried over MgSO$_4$ and concentrated under vacuum. The crude solid was purified by column chromatography on silica gel using a 50/50 mixture of methylene chloride and hexane to give a yellow solid that was further recrystallized once from hexane (15.37 g, 78%).

Synthesis of Block Co-polymer of Styrene with Diphenylaminostyrene (PS-pDPAS)

A round-bottom glass reactor was baked out under vacuum at 200° C. for 2 hours, then allowed to cool. The reactor was filled with dry nitrogen. Subsequently, 71.8 g of cyclohexane and 4.4 mL of tetrahydrofuran (THF) were added to the reactor by syringe. The THF was distilled from sodium/benzophenone solution under nitrogen prior to use, in order to scavenge water and oxygen. The cyclohexane was dried by passage through activated basic alumina, followed by sparging with nitrogen gas for 30 minutes prior to use. After addition of the solvents, the reaction flask was cooled to 3° C. in an ice water bath, after which 0.02 mL of styrene was added to the reactor. The styrene had previously been passed through activated basic alumina to remove inhibitors and water, and sparged with nitrogen gas to remove oxygen. A solution of s-butyllithium in cyclohexane (0.4 mL, 1.3 mol/L) was subsequently added to the reactor. The solution immediately turned orange, characteristic of the formation of polystyryl anion. After stirring at 3° C. for 2 hours, a solution of p-diphenylaminostyrene (1.61 g) in cyclohexane (20 mL) was added to the reactor by cannula. This solution had previously been degassed by repeatedly freezing it with liquid nitrogen and exposing it to vacuum. The solution was stirred overnight while warming to room temperature. The reaction was then terminated by addition of methanol, precipitated into a mixture of methanol and isopropanol, and dried under in a vacuum oven overnight, yielding 3.2 g of polymer. The resulting PS-pDPAS block polymer contained 74.1 mol % styrene and 25.9 mol % p-diphenylaminostyrene, based on $^{13}$C NMR. The molecular weight of the block copolymer was 7700 g/mol, based on gel permeation chromatography in THF against polystyrene standards.

OLED Preparation

OLEDs were formed as described in the Comparative Example 1 and Examples 1–3 except that the buffer layers were as follows:

Example 7: PS-pDPAS

Example 8: 93 wt. % PS-pDPAS and 7 wt. % F$_4$-TCNQ.

These buffer layers were spun-coat from their ca. 1.5% wt. solutions in toluene at the spin-rate of 2000 RPM (about 33 s$^{-1}$) to form ca. 90 nm thick films on the ITO coated substrates.

No short-circuiting was observed in any of the studied electroluminescent lamps. Luminance-voltage-current density screening of the OLEDs indicated that high efficiencies and low operational voltages were obtained. Doping PS-pDPAS with $F_4$-TCNQ significantly lowered the operational voltage of the OLEDs.

Comparative Example 2 and Examples 9 and 10

Buffer Layers Containing Conjugated Copolymers with Triarylamine Moieties in the Backbone This describes the preparation and characterization of an OLED with doped co-polymer based triarylamine hole injecting buffer layers. The buffer layers include PEDT (poly(3,4-ethylenedioxythiophene) available as CH8000 from Bayer AG, Leverkusen, Germany), undoped poly{(9-phenyl-9H-carbazole-3,6-diyl)[N,N'-bis(phenyl-4-yl)-N,N'-bis(4-butylphenyl)benzene-1,4-diamine]} (Cz-triarylamine), and Cz-triarylamine doped with $F_4$-TCNQ. An advantage of using Cz-triarylamine as a triarylamine-containing co-polymer for hole injecting buffer layers lies in the presence of phenylenediamine linkages, which typically cause lower ionization potential (higher energy of the highest occupied molecular orbital). This provides favorable conditions for increased conductivity due to doping with electron acceptors (e.g. $F_4$-TCNQ).

3,6-Dibromo-9-phenylcarbazole was made according to M. Park, J. R. Buck, C. J. Rizzo, J. Carmelo. Tetrahedron 119, 54 (42), 12707–12714, incorporated herein by reference. N,N'-bis(4-bromophenyl)-N,N'-bis(4-butylphenyl) benzene-1,4-diamine can be obtained in two steps from 1,4-phenylenediamine as reported in Raymond et al., Polymer Preprints 2001, 42(2), 587–588, incorporated herein by reference. Tricaprylylmethylammonium chloride is available from Aldrich Chemical Company under the trade name Aliquat® 336. All other materials were obtained from Aldrich Chemical Company.

Preparation of 9-Phenyl-3,6-bis(4,4,5,5-tetramethyl-1,3,2-dioxaborolan-2-yl)-9H-carbazole A 2 L flask was charged with 600 mL dry THF and 3,6-dibrimo-9-phenylcarbazole (60 g, 0.15 mole). This was cooled to $-78°$ C. with an acetone-dry ice bath. n-Butyl-lithium (138 mL of a 2.5M solution in hexanes, 0.34 mole) was added drop-wise via syringe. The reaction was stirred for 20 minutes and then warmed to $-50°$ C. The temperature was reduced to $-78°$ C. and 2-isopropoxy-4,4,5,5-tetramethyl-1,3,2-dioxaborolane (64 g, 0.34 mole) added via syringe at such a rate as to maintain the temperature below $-60°$ C. The reaction was maintained at $-78°$ C. for two hours and then poured into an aqueous solution of ammonium acetate (90 g in 2100 mL water). The layers were phase separated and the aqueous phase extracted with methyl tert-butyl ether (2×200 mL). The combined organic phase and extracts were washed with brine (2×200 mL) and dried over magnesium sulfate. Concentration and re-crystallization of the solid obtained form acetone gave pure 9-phenyl-3,6-bis(4,4,5,5-tetramethyl-1,3,2-dioxaborolan-2-yl)-9H-carbazole (12 g, 16% yield).

Preparation of Poly{(9-phenyl-9H-carbazole-3,6-diyl)[N,N'-bis(phenyl-4-yl)-N,N'-bis(4-butylphenyl)benzene-1,4-diamine]} (Cz-triarylamine- Formula 32 above)

In a 50 mL round bottomed flask fitted with a rubber septum and reflux condenser were introduced 9-phenyl-3,6-bis(4,4,5,5-tetramethyl-1,3,2-dioxaborolan-2-yl)-9H-carbazole (0.79 g, 1.59 mmole, 5 equivalents), N,N'-bis(4-bromophenyl)-N,N'-bis(4-butylphenyl)benzene-1,4-diamine (0.65 g, 0.952 mmol, 3 equivalents), Aliquat® 336 (0.16 g, 0.405 mmole, 1.28 equivalents), 2M sodium carbonate solution (5.4 mL, 10.8 mmol, 34 equivalents) and 20 mL toluene. This was purged with a stream of nitrogen for 30 min. Under a nitrogen purge, tetrakistriphenylphosphine palladium (0) (10 mg, 0.0.0068 mmole, 0.02 equivalents) was added. The reaction mixture was then refluxed for 16 hrs. A solution of 0.5 g bromobenzene in 5 mL purged toluene was added followed by and a further charge of tetrakistriphenylphosphine paladium (0) (10 mg) and refluxing then continued for a further 16 hrs.

The reaction was then cooled to room temperature and 30 mL water added. The organic layer was separated and washed with water followed by brine. Precipitation into methanol, filtration and vacuum drying of the solid thus obtained gave 0.62 g of the required hole transport polymer. Molecular weight determination by gel permeation chromatography versus polystyrene standards gave Mw $2.39 \times 10^3$, Mn $1.49 \times 10^3$ and polydispersity of 1.67

OLED Preparation

OLEDs were formed as described in the Comparative Example 1 and Examples 1–3 except that the buffer layers were as follows:

Comparative Example 2: PEDT
Example 9: Cz-triarylamine
Example 10: 93 wt. % Cz-triarylamine and 7 wt. % $F_4$-TCNQ.

These buffer layers were spun-coat from their ca. 1.5% wt. solutions in toluene at the spin-rate of 2000 RPM (about 33 s$^{-1}$) to form ca. 90 nm thick films on the ITO coated substrates.

No short-circuiting was observed in any of the studied electroluminescent lamps. Devices with both doped and undoped Cz-triarylamine-based buffer layer showed high external quantum efficiencies. Devices with undoped Cz-triarylamine buffer layer showed noticeably higher operational voltages than those made on PEDT. Upon doping Cz-triarylamine with $F_4$-TCNQ, operational voltages decreased to the level of those observed for PEDT-based LEDs. This indicates that Cz-triarylamine possesses an ionization potential which is low enough for efficient $F_4$-TCNQ doping to increase conductivity in the hole-injecting buffer layer.

Preliminary operation stability studies on devices incorporating Cz-triarylamine buffer layer carried out in the constant current continuous sweep regime at current density levels of ca. 1.8 mA/cm$^2$ (luminance of 100–150 Cd/m$^2$) suggest that Cz-triarylamine-based buffer layers can be used to achieve improved operational lifetime in OLEDs.

Examples 11–13

Absorptive Dye Doped Color Converting Buffer Layers

This Example describes the fabrication of hole-injecting solution-processed buffer layers based on doped triarylamines blended with electroactive polymer binder and blended with color-converting organic dye material in order to tune electroluminescence energy and CIE color coordinates of the OLEDs incorporating such buffer layers.

Three solutions consisting of a) 30 mg poly(vinyl carbazole) (PVK, Aldrich Chemical Co.), 20 mg MTDATA (H. W. Sands Corp., Jupiter, Fla.), 2 mg $F_4$-TCNQ (TCI America, Portland, Oreg.), 3.7 ml $CHCl_3$, b) 30 mg PVK, 20 mg MTDATA, 2 mg $F_4$-TCNQ, 75 mg 1,4-bis(2-methyl-6-ethyl anilino) anthraquinone (Dye), 3.7 ml $CHCl_3$ and, c) 30 mg PVK, 20 mg MTDATA, 2 mg $F_4$-TCNQ, 117 mg 1,4-bis(2-methyl-6-ethyl anilino) anthraquinone (Dye), 3.7 ml $CHCl_3$ were prepared. The Dye can be prepared according to U.S. Pat. No. 5,639,896, incorporated herein by reference and is available as "Amaplast Blue RFC" supplied by "American Aniline Products", N.Y., N.Y., a unit of Koppers Co., Pittsburgh, Pa. Each solution was then spun coat onto cleaned ITO substrates at 3000 R.P.M. for 30s. A vapor deposited small-molecule OLED with NPD (20 nm, 0.2 nm/s), AlQ (50 nm, 0.1 nm/s), LiF (0.7 nm, 0.05 nm/s), Al (200 nm, 2 nm/s) was sequentially deposited on top in a standard vacuum deposition procedure at $10^{-6}$ torr (about $10^{-4}$ Pa) as described in Comparative Example 1 and Examples 1–3.

OLEDs were formed as described in the Comparative Example 1 and Examples 1–3 except that the buffer layers were as follows:

Example 11: Solution a) corresponding to 58 wt. % PVK, 38 wt. % MTDATA, and 4 wt. % $F_4$-TCNQ Example 12: Solution b) corresponding to 24 wt. % PVK, 16 wt. % MTDATA, 2 wt. % $F_4$-TCNQ, and 58 wt. % Dye Example 13: Solution c) corresponding to 18 wt. % PVK, 12 wt. % MTDATA, 1 wt. % $F_4$-TCNQ, and 69 wt. % Dye.

Devices containing the dye in the buffer layer exhibit a clear change in the electroluminescence spectrum and the corresponding C.I.E coordinates due to selective absorption of the AlQ emission by the dye. CIE color coordinates for two hole-injecting buffer layer compositions containing the studied dye material in different concentrations as well as those for the control device are shown in Table I.

TABLE I

| | Color Coordinate Shift | |
|---|---|---|
| Sample | CIE (x) | CIE (y) |
| Example 11 | 0.34 | 0.55 |
| Example 12 | 0.20 | 0.56 |
| Example 13 | 0.17 | 0.57 |

Example 14

Preparation of an OLED Device Using Thermal Transfer

Preparation of a Donor Sheet without a Transfer Layer

A thermal transfer donor sheet was prepared in the following manner:

An LTHC solution, given in Table II, was coated onto a 0.1 mm thick polyethylene terephthalate (PET) film substrate (M7 from Teijin, Osaka, Japan). Coating was performed using a Yasui Seiki Lab Coater, Model CAG-150, using a microgravure roll with 150 helical cells per inch. The LTHC coating was in-line dried at 80° C. and cured under ultraviolet (UV) radiation.

TABLE II

| LTHC Coating Solution | | |
|---|---|---|
| Component | Trade Designation | Parts by Weight |
| carbon black pigment | Raven 760 Ultra [1] | 3.55 |
| polyvinyl butyral resin | Butvar B-98 [2] | 0.63 |
| acrylic resin | Joncryl 67 [3] | 1.90 |
| Dispersant | Disperbyk 161 [4] | 0.32 |
| Surfactant | FC-430 [5] | 0.09 |
| epoxy novolac acrylate | Ebecryl 629 [6] | 12.09 |
| acrylic resin | Elvacite 2669 [7] | 8.06 |
| 2-benzyl-2-(dimethylamino)-1-(4-(morpholinyl)phenyl)butanone | Irgacure 369 [8] | 0.82 |
| 1-hydroxycyclohexyl phenyl ketone | Irgacure 184 [8] | 0.12 |
| 2-butanone | | 45.31 |
| 1,2-propanediol monomethyl ether acetate | | 27.19 |

[1] available from Columbian Chemicals Co., Atlanta, GA
[2] available from Solutia Inc., St. Louis, MO
[3] available from S. C. Johnson & Son, Inc. Racine, WI
[4] available from Byk-Chemie USA, Wallingford, CT
[5] available from Minnesota Mining and Manufacturing Co., St. Paul, MN
[6] available from UCB Radcure Inc., N. Augusta, SC
[7] available from ICI Acrylics Inc., Memphis, TN
[8] available from Ciba-Geigi Corp., Tarrytown, NY Next, an interlayer solution, given in Table III, was coated onto the cured LTHC layer by a rotogravure coating method using the Yasui Seiki lab coater, Model CAG-150, with a microgravure roll having 180 helical cells per lineal inch. This coating was in-line dried at 60° C. and cured under ultraviolet (UV) radiation.

TABLE III

| Interlayer Coating Solution | |
|---|---|
| COMPONENT | PARTS BY WEIGHT |
| SR 351 HP (trimethylolpropane triacrylate ester, available from Sartomer, Exton, PA) | 14.85 |
| Butvar B-98 | 0.93 |
| Joncryl 67 | 2.78 |
| Irgacure 369 | 1.25 |
| Irgacure 184 | 0.19 |
| 2-butanone | 48.00 |
| 1-methoxy-2-propanol | 32.00 |

Preparation of Solutions for Receptor

The following solutions were prepared and used in the preparation of layers on the receptor substrate:

MTDATA: (4,4',4''-tris(N-(3-methylphenyl)-N-phenylamino)triphenylamine) (OSA 3939, H. W. Sands Corp., Jupiter, Fla.) 1.0% (w/w) in toluene was filtered and dispensed through a Whatman Puradisc™ 0.45 μm Polypropylene (PP) syringe filter.

PVK: Poly(9-vinylcarbazole) (Aldrich Chemical Co., Milwaukee, Wis.) 1.0% (w/w) in toluene was filtered and dispensed through a Whatman Puradisc™ 0.45 μm Polypropylene (PP) syringe filter.

$F_4$-TCNQ: Tetrafluorotetracyanoquinodimethane (Tokyo Kasei Kogyo Co., Tokyo, Japan) 0.25% (w/w) in toluene was filtered and dispensed through a Whatman Puradisc™ 0.45 μm Polypropylene (PP) syringe filter.

MTDATA/$F_4$-TCNQ: 98/2 w/w % mixture of MTDATA/$F_4$-TCNQ.

MTDATA/PVK: 65/35 w/w % mixture of MTDATA/PVK
MTDATA/PVK/$F_4$-TCNQ: 64/35/1 w/w/w % mixture of MTDATA/PVK/$F_4$-TCNQ Preparation of Receptors Receptors were formed as follows: ITO(indium tin oxide) glass (Delta Technologies, Stillwater, Minn., less than 100 Ω/square, 1.1 mm thick) was processed using photolithography to provide a patterned ITO structure capable of making an electroluminescent device. The substrate was ultrasonically cleaned in a hot, 3% solution of Deconex 12NS (Borer Chemie AG, Zuchwil Switzerland). The substrates were then placed in the Plasma Science plasma treater for surface treatment under the following conditions:

| Time: | 2 minutes |
|---|---|
| Power: | 500 watt (165 W/cm$^2$) |
| Oxygen Flow: | 100 sccm |

Immediately after plasma treatment, a solution of material was applied to the surface of the ITO according to Table IV below.

TABLE IV

Preparation of receptors

| Receptor number | Receptor Coating Solution | Composition | Spin speed (RPM) | Film thickness (nm) |
|---|---|---|---|---|
| 1 | MTDATA | Neat | 1000 | 40 |
| 2 | MTDATA/F$_4$-TCNQ | 98/2 w/w % | 1000 | 40 |
| 3 | MTDATA/PVK | 65/35 w/w % | 1000 | 40 |
| 4 | MTDATA/PVK/F$_4$-TCNQ | 64/35/1 w/w/w % | 1000 | 40 |

Preparation of Solutions for Transfer Layer

The following solutions were prepared:

Covion Super Yellow: Covion PPV polymer PDY 132 "Super Yellow" (75 mg) from Covion Organic Semiconductors GmbH, Frankfurt, Germany was weighed out into an amber vial with a PTFE cap. To this was added 9.925 g of toluene (HPLC grade obtained from Aldrich Chemical, Milwaukee, Wis.). The solution was stirred over night. The solution was filtered through a 5 µm Millipore Millex syringe filter.

Polystyrene: Polystyrene (250 mg) from Aldrich Chemical, Milwaukee, Wis. ($M_w$=2,430) was dissolved in 9.75 g of toluene (HPLC grade obtained from Aldrich Chemical, Milwaukee, Wis.). The solution was filtered through a 0.45 µm polypropylene (PP) syringe filter.

Preparation of Transfer Layers on Donor Sheet and Transfer of Transfer Layers

Transfer layers were formed on the donor sheets using a 33/67 w/w % blend of the solutions of Covion Super Yellow and polystyrene from the previous section. To obtain the blends, the above-described solutions were mixed at the appropriate ratios and the resulting blend solutions were stirred for 20 min at room temperature.

The transfer layers were disposed on the donor sheets by spinning (Headway Research spincoater) the blend solution at about 2000–2500 rpm for 30 s to yield a film thickness of approximately 100 nm.

The donor sheets coated with Covion Super Yellow/polystyrene were brought into contact with each of the receptor substrates prepared in an above section. Next, the donor sheets were imaged using two single-mode Nd:YAG lasers. Scanning was performed using a system of linear galvanometers, with the combined laser beams focused onto the image plane using an f-theta scan lens as part of a near-telecentric configuration. The laser energy density was 0.4 to 0.8 J/cm$^2$. The laser spot size, measured at the 1/e$^2$ intensity, was 30 micrometers by 350 micrometers. The linear laser spot velocity was adjustable between 10 and 30 meters per second, measured at the image plane. The laser spot was dithered perpendicular to the major displacement direction with about a 100 nm amplitude. The transfer layers were transferred as lines onto the receptor substrates, and the intended width of the lines was about 100 nm.

The transfer layers were successfully transferred in a series of lines that were in overlying registry with the ITO stripes on the receptor substrates, resulting in good imaging transfer.

Preparation of OEL Devices

Electroluminescent devices were prepared by depositing calcium/silver cathodes on top of the LEP (Covion Super Yellow/PS) transferred in the above section. Approximately 40 nm of calcium was vapor deposited at a rate of 0.11 nm/s onto the LEP, followed by approximately 400 mn of silver at a rate of 0.5 nm/s. In all cases, diode behavior and yellow light emission was observed.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

The invention claimed is:

1. A method of making an electroluminescent device comprising:
   forming an electrode on a receptor substrate;
   forming a buffer layer over the electrode, the buffer layer comprising a triarylamine hole transport material, and an electron acceptor material;
   forming a transfer layer on a donor substrate, the transfer layer comprising an emission layer; and
   selectively thermally transferring a portion of the transfer layer from the donor to the buffer layer,
   wherein the electrode, buffer layer, and transfer layer are in electrical communication, and the emission layer comprises a light emitting material.

2. The method of claim 1, where the transfer layer further comprises at least one of a hole transport layer, a hole blocking layer, an electron transport layer, an electron blocking layer, an electron injection layer and a second electrode layer.

3. The method of claim 1, further comprising disposing a hole transport layer over the buffer layer prior to selectively transferring the transfer layer over the buffer layer.

4. The method of claim 1, wherein the buffer layer further comprises at least one of a polymeric binder and a crosslinked polymeric binder.

5. The method of claim 4, wherein the polymeric binder or the crosslinked polymeric binder is electroactive.

6. The method of claim 4, wherein the polymeric binder or the crosslinked polymeric binder is electrically inert.

7. The method of claim 1, wherein the buffer layer further comprises a color converting material.

8. A method of making an electroluminescent device comprising:

forming an electrode on a receptor substrate, forming a first transfer layer on a donor substrate, the first transfer layer comprising a buffer layer, wherein the buffer layer comprises a triarylamine hole transport material and an electron acceptor material;

selectively thermally transferring a portion of the first transfer layer onto the receptor substrate, and in electrical communication with the electrode;

forming a second transfer layer on a donor substrate, the second transfer layer comprising an emission layer; and selectively thermally transferring a portion of the second transfer layer from the donor to the first transfer layer on the receptor substrate, wherein the electrode, first transfer layer, and second transfer layer are in electrical communication, and the emission layer comprises a light emitting material.

9. The method of claim 8, where the second transfer layer further comprises at least one of a hole transport layer, a hole blocking layer, an electron transport layer, an electron blocking layer, an electron injection layer and a second electrode layer.

10. The method of claim 8, further comprising disposing a hole transport layer over the buffer layer prior to selectively transferring the transfer layer over the buffer layer.

11. The method of claim 8, wherein the buffer layer further comprises at least one of a polymeric binder and a crosslinked polymeric binder.

12. The method of claim 11, wherein the polymeric binder or the crosslinked polymeric binder is electroactive.

13. The method of claim 11, wherein the polymeric binder or the crosslinked polymeric binder is electrically inert.

14. The method of claim 8, wherein the buffer layer further comprises a color converting material.

* * * * *

UNITED STATES PATENT AND TRADEMARK OFFICE
CERTIFICATE OF CORRECTION

PATENT NO.        : 7,166,010 B2
APPLICATION NO.   : 11/118574
DATED             : January 23, 2007
INVENTOR(S)       : Sergey A. Lamansky It is certified that error appears in the above-identified patent and that said Letters Patent is hereby corrected as shown below:

Column 8 (Structure 8),

Lines 43-52 (approx.), Delete " 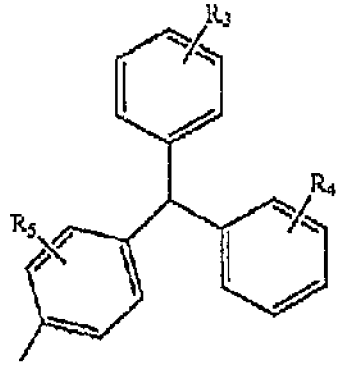 " and insert -- 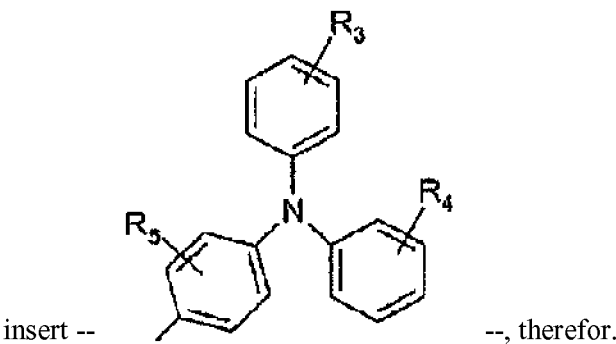 --, therefor.

Column 11 (Structure 15),

Lines 24-32 (approx.), Delete " 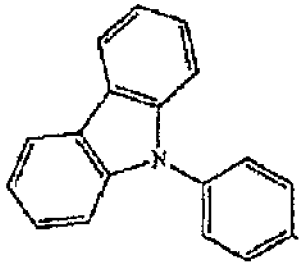 " and insert -- 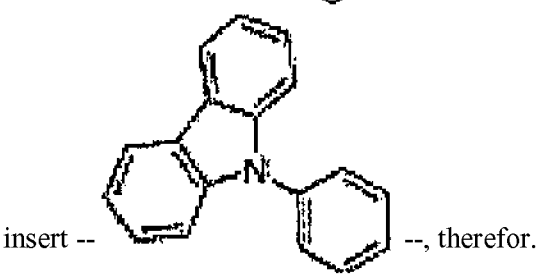 --, therefor.

UNITED STATES PATENT AND TRADEMARK OFFICE
CERTIFICATE OF CORRECTION

PATENT NO. : 7,166,010 B2
APPLICATION NO. : 11/118574
DATED : January 23, 2007
INVENTOR(S) : Sergey A. Lamansky It is certified that error appears in the above-identified patent and that said Letters Patent is hereby corrected as shown below:

Column 13 (Structure 22),

Lines 47-52 (approx.) Delete " 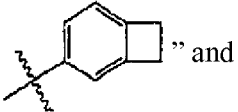 " and insert -- 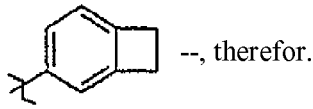 --, therefor.

Column 13 (Structure 23),

Lines 53-64 (approx.) Delete " 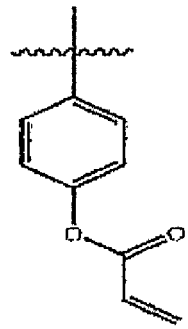 " and insert -- 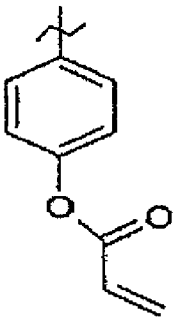 --, therefor.

UNITED STATES PATENT AND TRADEMARK OFFICE
CERTIFICATE OF CORRECTION

PATENT NO. : 7,166,010 B2
APPLICATION NO. : 11/118574
DATED : January 23, 2007
INVENTOR(S) : Sergey A. Lamansky It is certified that error appears in the above-identified patent and that said Letters Patent is hereby corrected as shown below:

Column 29,
Line 30, Delete "(about $10^{-1}$ -$10^{-9}$ $m^2$ V s))" and insert -- (about $10^{-10}$ -$10^{-9}$ $m^2$/ V s)) --, therefor.

Column 36,
Line 23 (approx.), After "400" delete "mn" and insert -- nm --, therefore.

Signed and Sealed this

Tenth Day of July, 2007

JON W. DUDAS
*Director of the United States Patent and Trademark Office*